(12) United States Patent
Sashida et al.

(10) Patent No.: US 7,655,531 B2
(45) Date of Patent: Feb. 2, 2010

(54) SEMICONDUCTOR DEVICE AND METHOD FOR FABRICATING THE SAME

(75) Inventors: Naoya Sashida, Kanagawa (JP); Tatsuya Yokota, Kanagawa (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/292,980

(22) Filed: Dec. 2, 2008

(65) Prior Publication Data
US 2009/0130815 A1 May 21, 2009

Related U.S. Application Data

(60) Division of application No. 11/540,537, filed on Oct. 2, 2006, now Pat. No. 7,473,980, which is a continuation of application No. PCT/JP2004/007259, filed on May 27, 2004.

(51) Int. Cl.
*H01L 21/20* (2006.01)
(52) U.S. Cl. .................. 438/396; 257/E21.008
(58) Field of Classification Search ............ 438/396; 257/E21.008
See application file for complete search history.

(56) References Cited

U.S. PATENT DOCUMENTS

| | | | |
|---|---|---|---|
| 6,611,014 B1 | 8/2003 | Kanaya et al. | |
| 6,911,686 B1 | 6/2005 | Itoh | |
| 6,953,950 B2 | 10/2005 | Sashida | |
| 7,473,980 B2 * | 1/2009 | Sashida et al. | 257/532 |
| 2003/0030085 A1 | 2/2003 | Ishihara | |
| 2003/0060007 A1 | 3/2003 | Igarashi | |

FOREIGN PATENT DOCUMENTS

| | | |
|---|---|---|
| JP | 2001-36026 A | 2/2001 |
| JP | 2002-141485 A | 5/2002 |
| JP | 2002-176149 A | 6/2002 |
| JP | 2003-60164 A | 2/2003 |
| JP | 2003-100994 A | 4/2003 |
| JP | 2003-100995 A | 4/2003 |
| JP | 2004-95861 A | 3/2004 |

OTHER PUBLICATIONS

International Search Report of PCT/JP2004/007259 date of Mailing Sep. 7, 2004.

* cited by examiner

*Primary Examiner*—Mark Prenty
(74) *Attorney, Agent, or Firm*—Westerman, Hattori, Daniels & Adrian, LLP

(57) ABSTRACT

The semiconductor device comprises a capacitor formed over a semiconductor substrate 10 and including a lower electrode 32, a dielectric film 34 formed over the lower electrode and an upper electrode 36 formed over the dielectric film, a first insulation film 42 formed over the semiconductor substrate and the capacitor, a first interconnection 48 formed over the first insulation film and electrically connected to the capacitor, a first hydrogen diffusion preventive film 50 for preventing the diffusion of hydrogen formed over the first insulation film, covering the first interconnection, a second insulation film 58 formed over the first hydrogen diffusion preventive film and having the surface planarized, a third insulation film 62 formed over the second insulation film, a second interconnection 70b formed over the third insulation film, and a second hydrogen diffusion preventive film 72 for preventing the diffusion of hydrogen formed on the third insulation film, covering the second interconnection. Since the second hydrogen diffusion preventive film positioned above the capacitor is planarized, the dielectric film is surely prevented from being reduced with hydrogen.

4 Claims, 41 Drawing Sheets

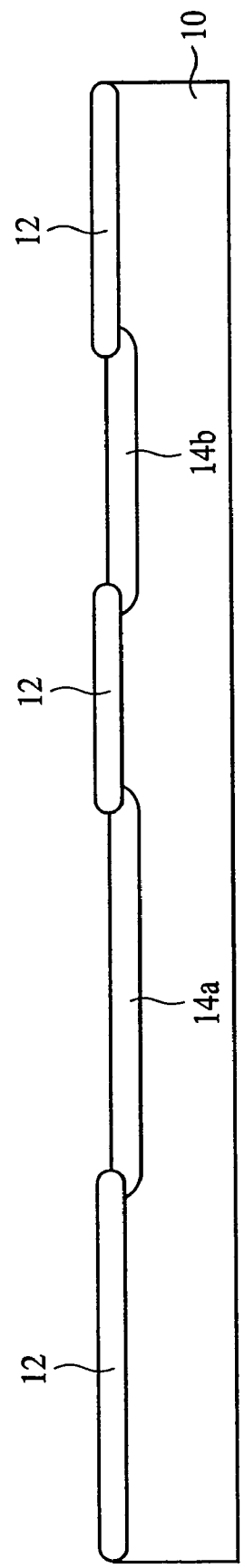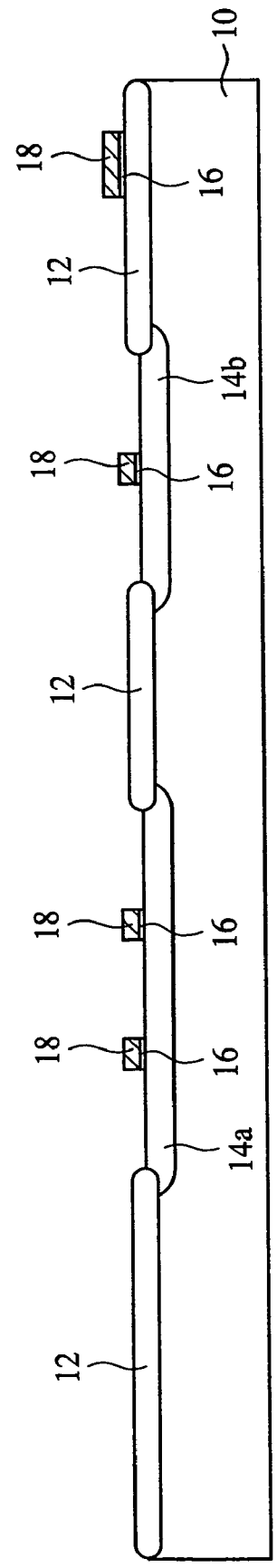

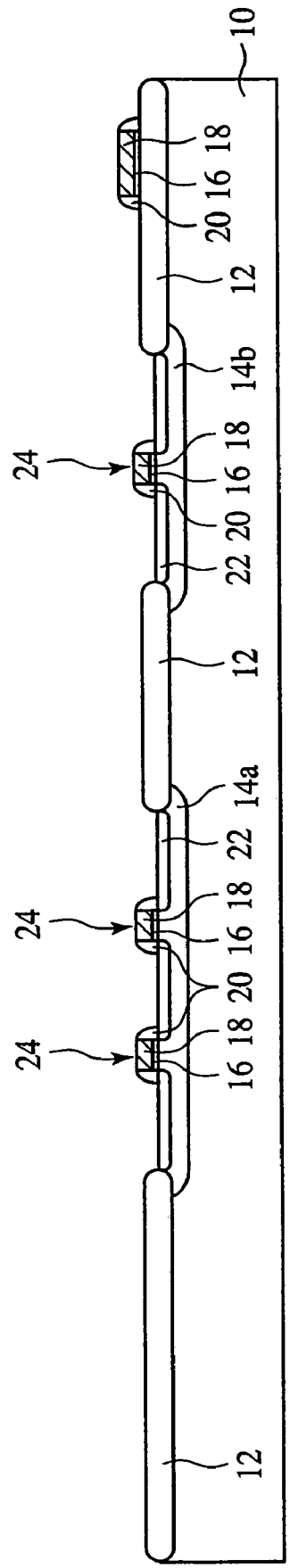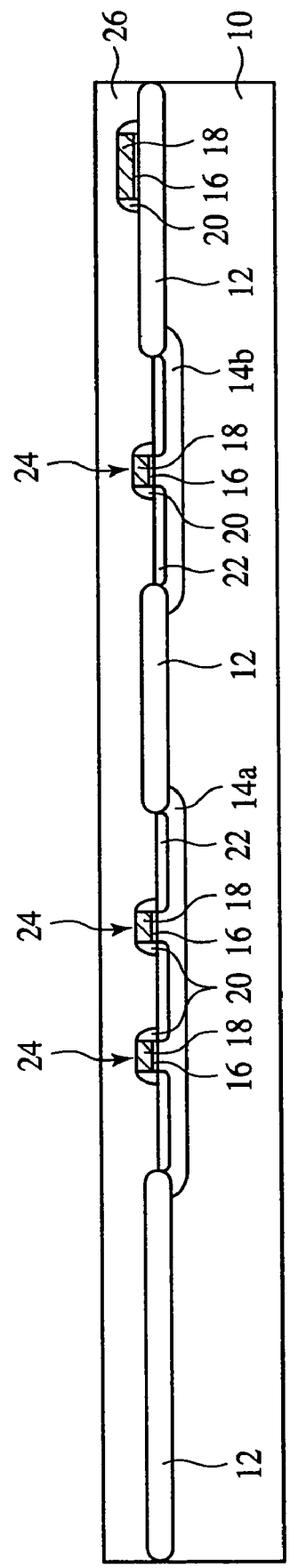

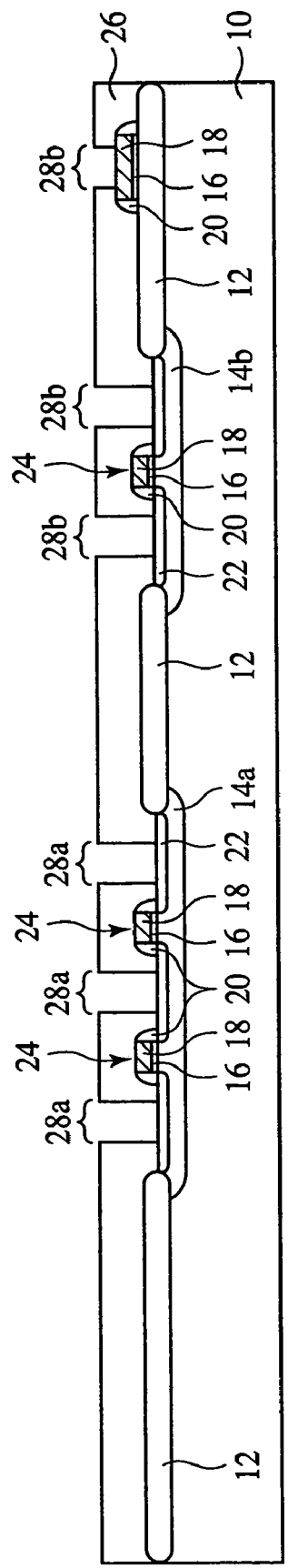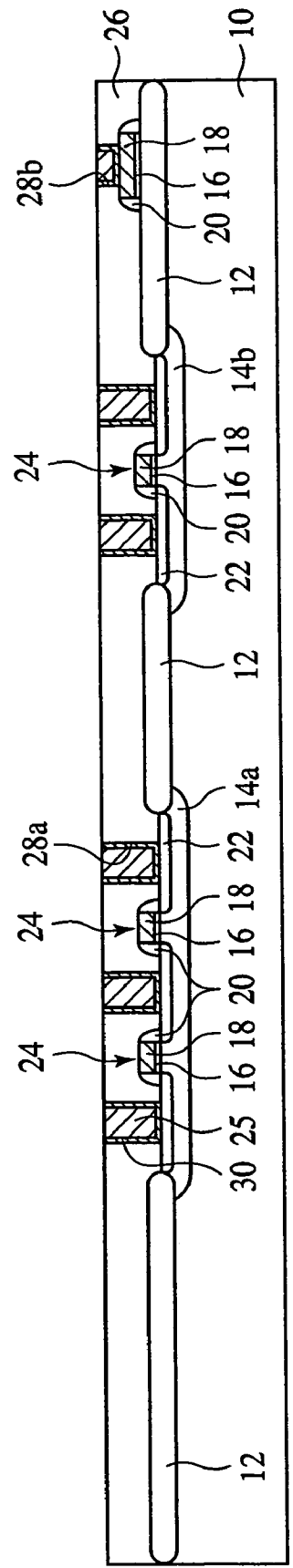

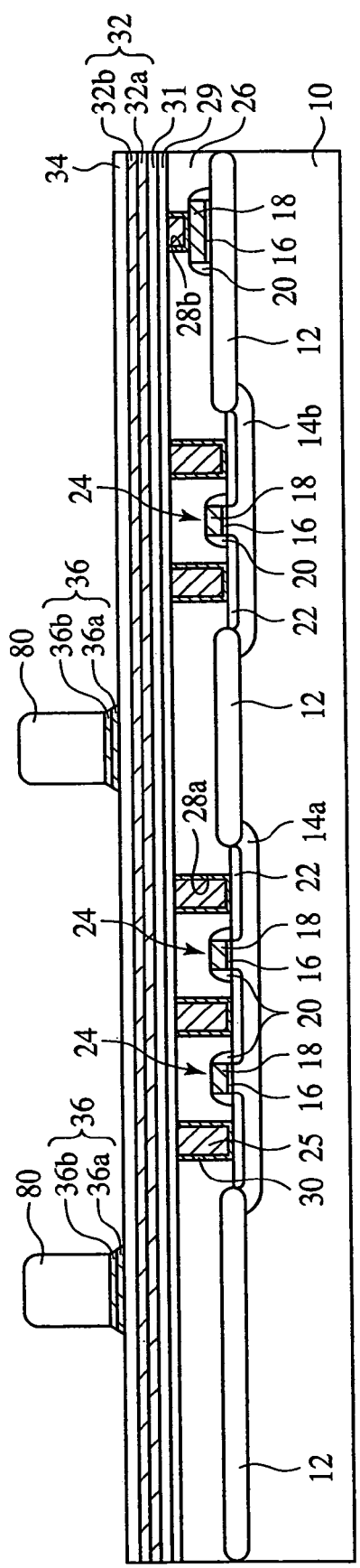
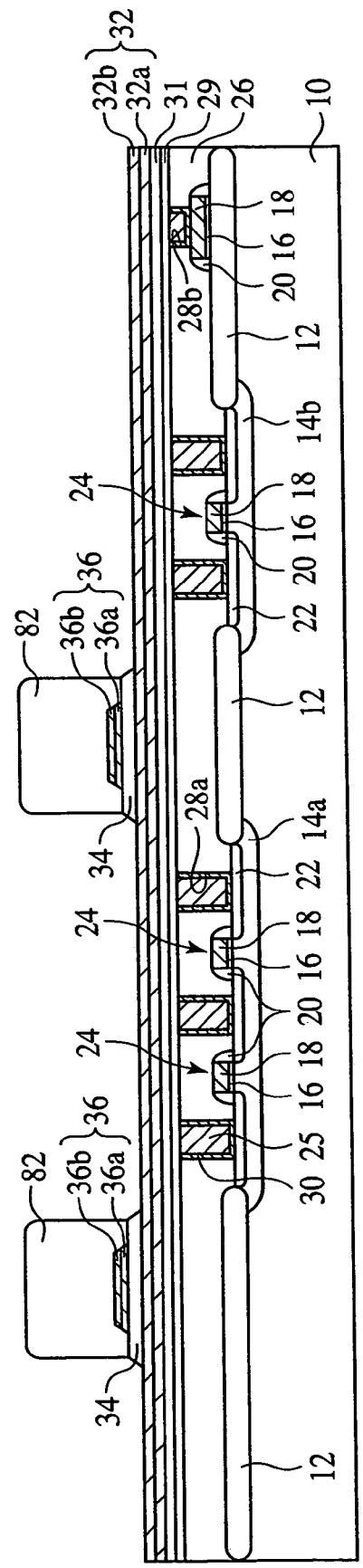

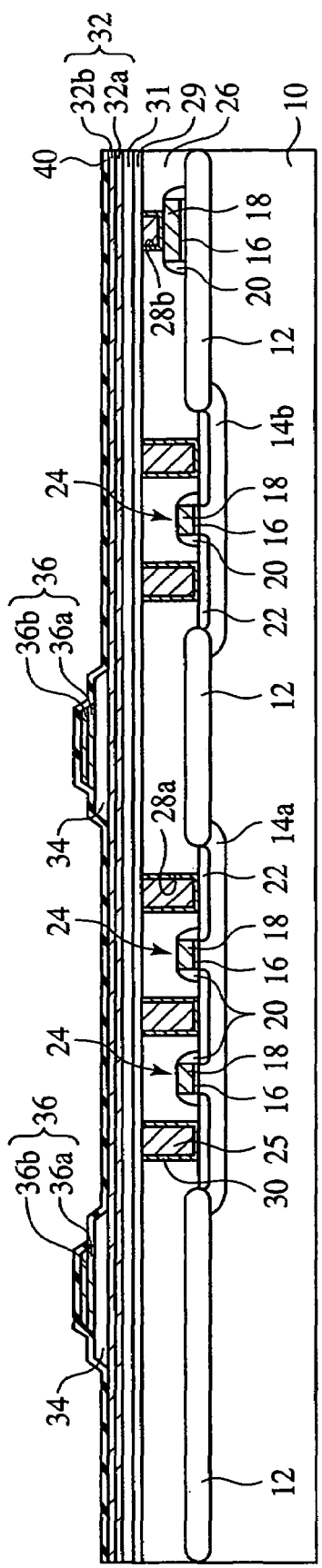
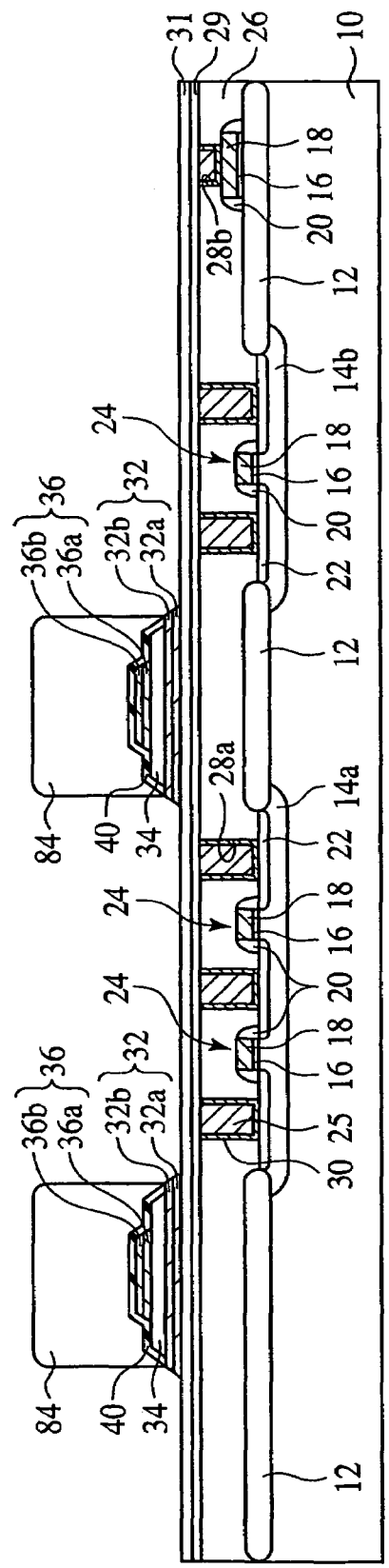

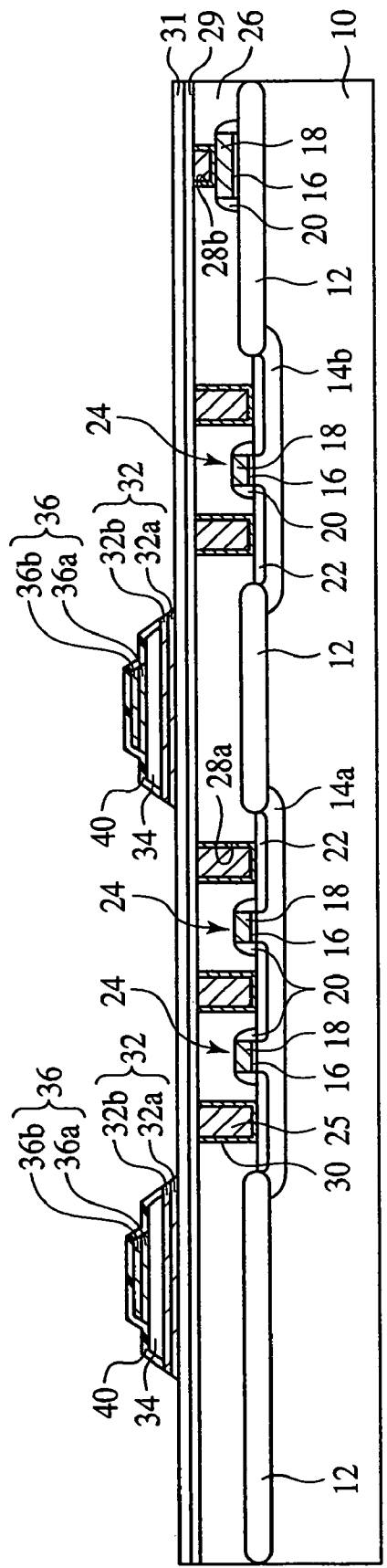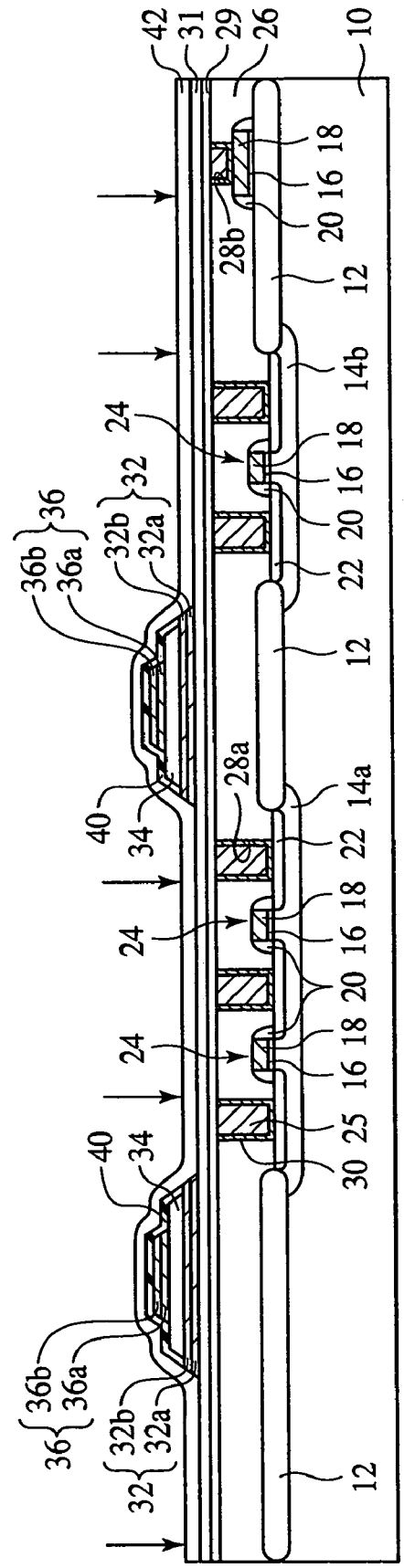

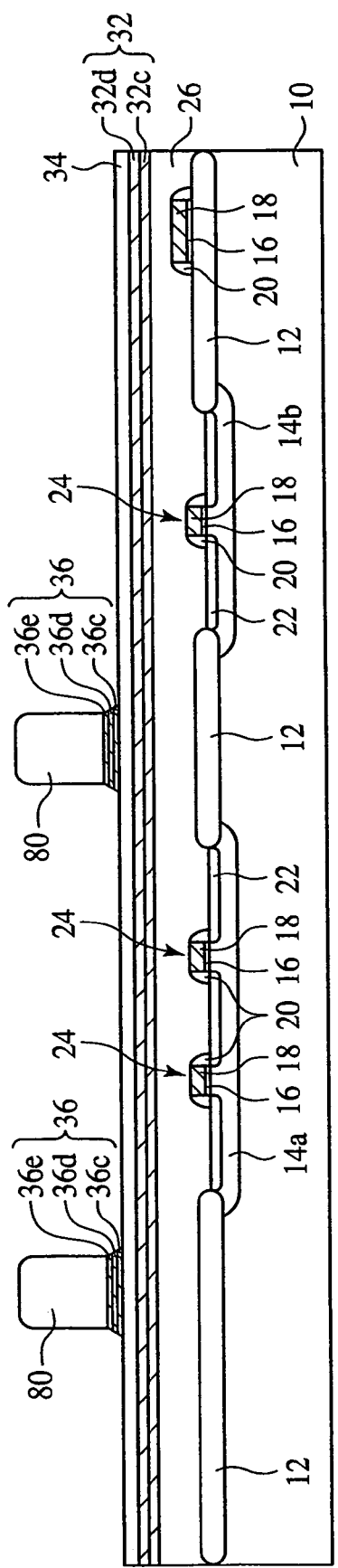
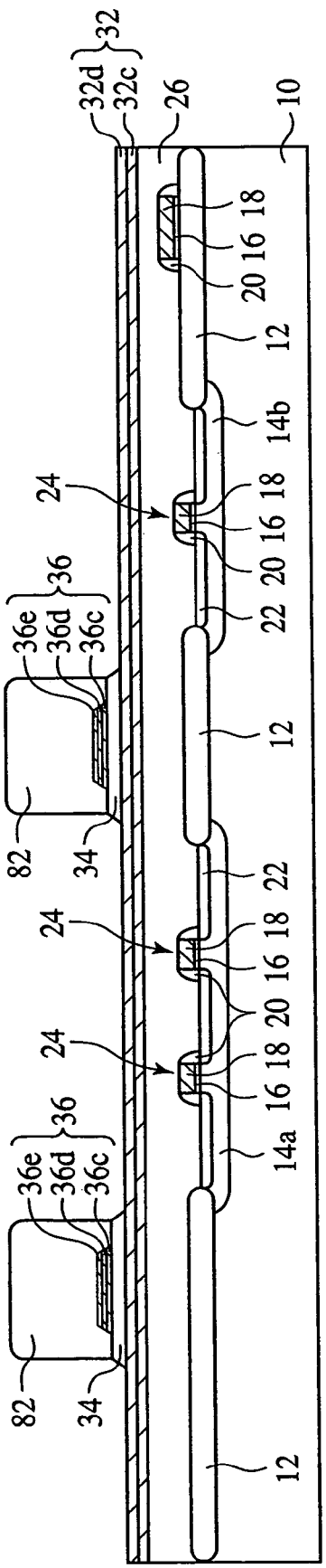

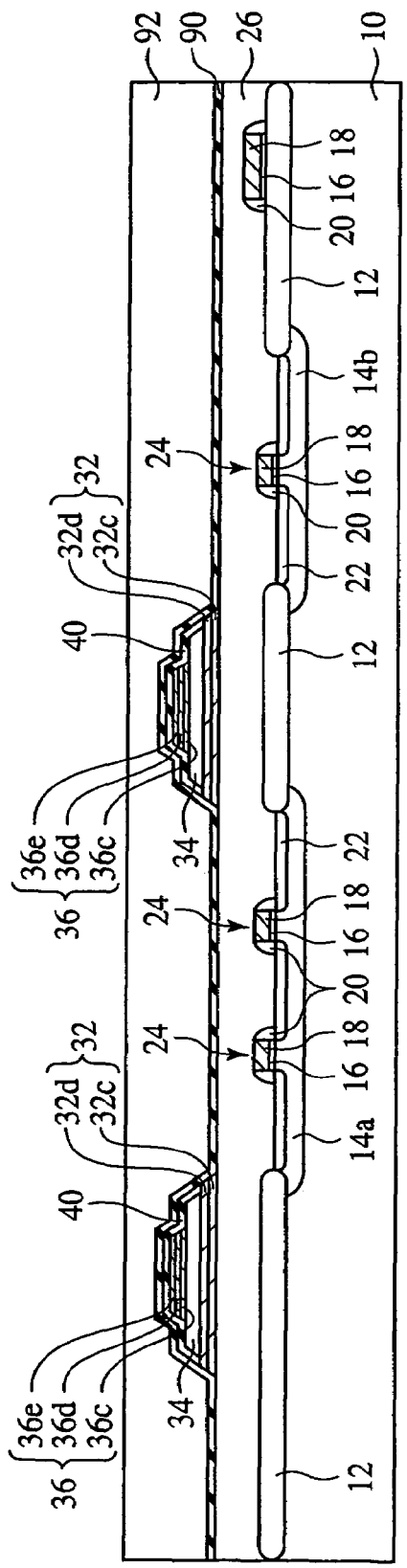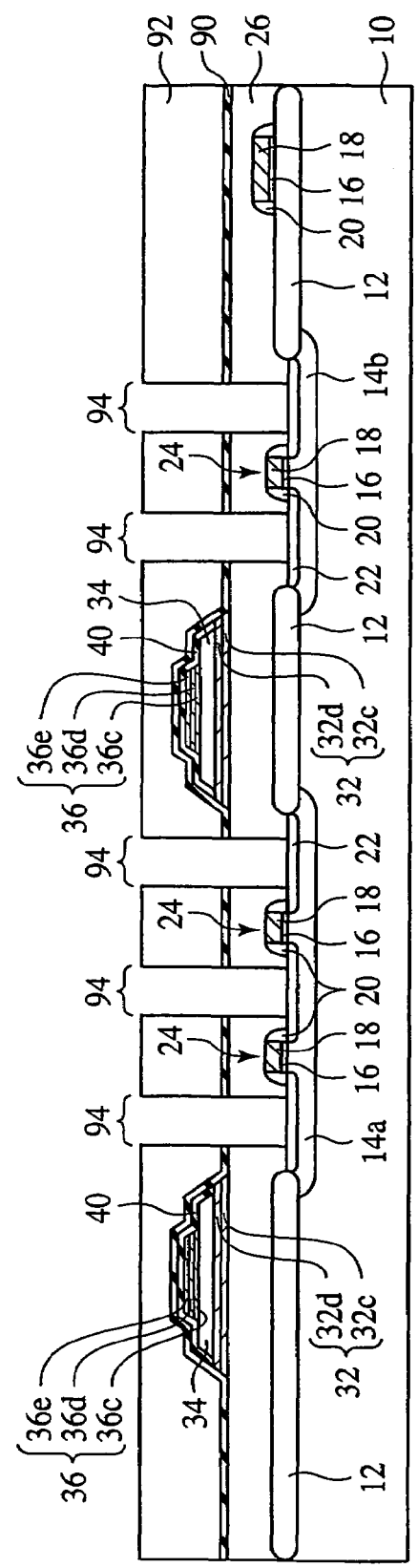

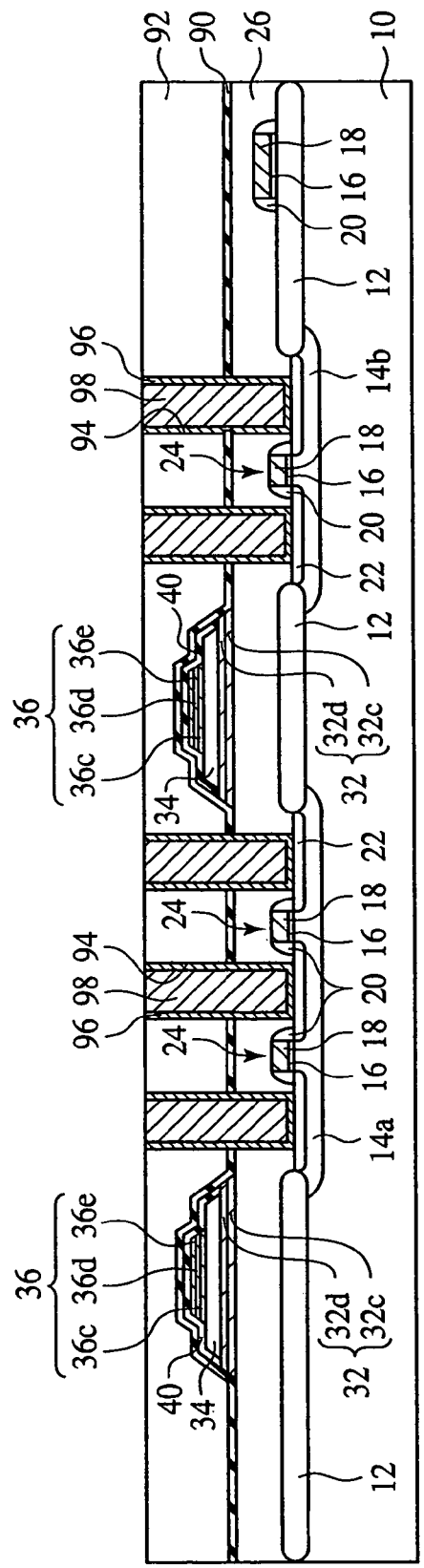
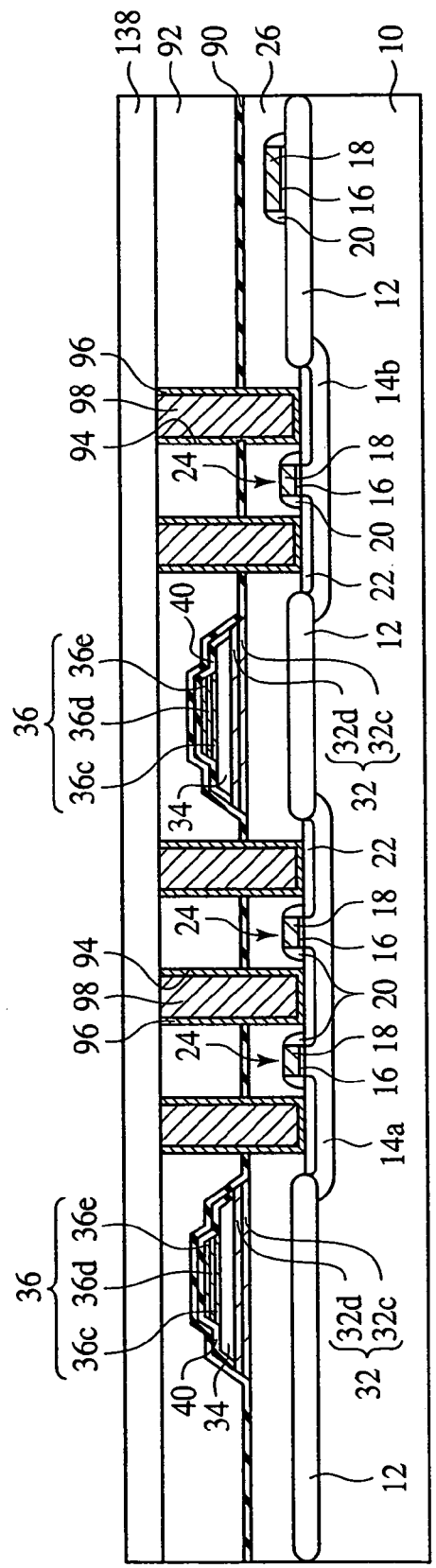
FIG. 26A
FIG. 26B

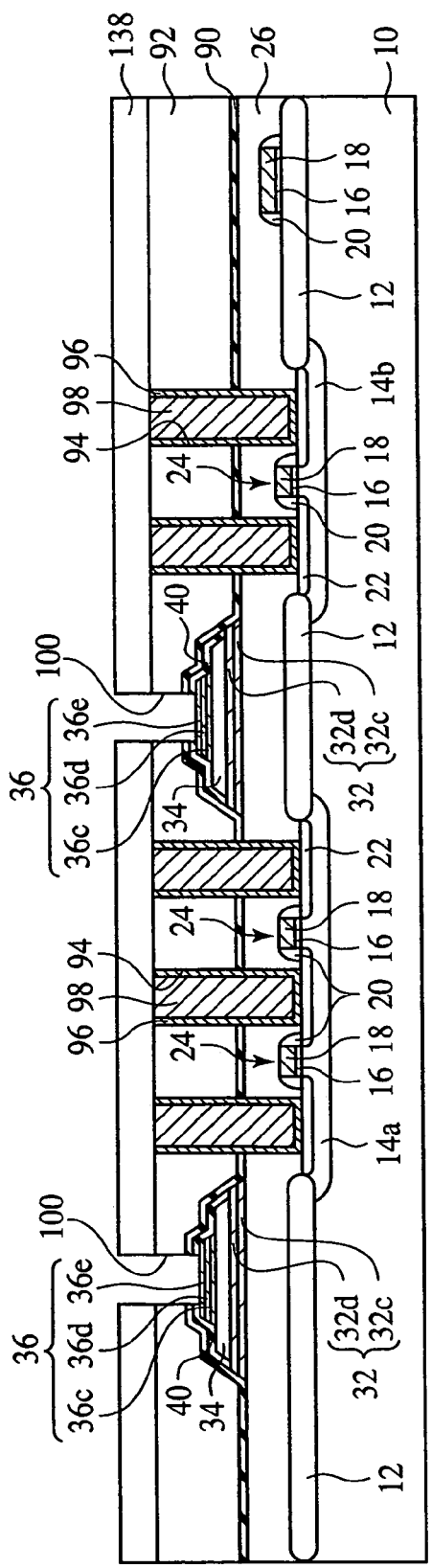
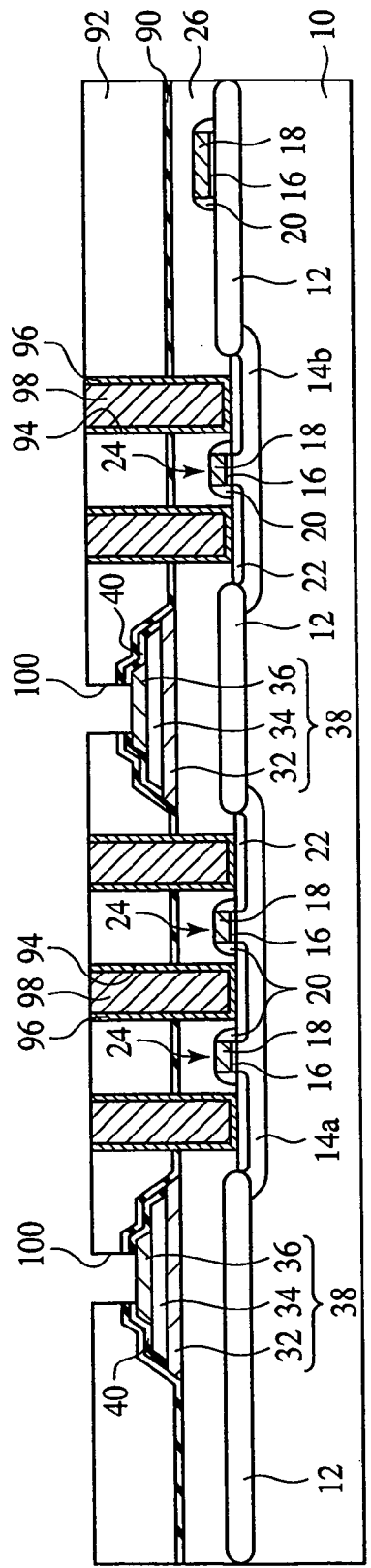

SEMICONDUCTOR DEVICE AND METHOD FOR FABRICATING THE SAME

CROSS REFERENCE TO RELATED APPLICATION

This application is a divisional application of application Ser. No. 11/540,537, filed on Oct. 2, 2006, which is a Continuation of PCT application No. PCT/JP2004/007259, filed on May 27, 2004, the entire contents of which are hereby incorporated by reference.

TECHNICAL FIELD

The present invention relates to a semiconductor device and a method for fabricating the semiconductor device, more specifically, a semiconductor device including a capacitor using a high dielectric substance or a ferroelectric substance as the dielectric film, and a method for fabricating the semiconductor device.

BACKGROUND ART

Recently, the use of high dielectric substances and ferroelectric substances as the capacitor dielectric film is noted.

However, in the case that a high dielectric substance or a ferroelectric substance is used simply as the dielectric film, it is often that oxygen in the dielectric film is reduced with hydrogen in the steps following the formation of the dielectric film, and the capacitor cannot have good electric characteristics.

As techniques for preventing the deterioration of the dielectric film with hydrogen, the technique of forming an aluminum oxide film, covering the capacitor, and the technique of forming an aluminum oxide film on the inter-layer insulation film formed on the capacitor are proposed. Aluminum oxide film has the function of preventing the diffusion of hydrogen. Owing to this function, the proposed techniques can prevent the arrival of the hydrogen at the dielectric film, and the deterioration of the dielectric film with the hydrogen can be prevented. These techniques are disclosed in, e.g., Patent Reference 1.

[Patent Reference 1]
Specification of Japanese Patent Application Unexamined Publication No. 2002-176149

DISCLOSURE OF THE INVENTION

[Problems to be Solved by the Invention]

However, the techniques disclosed in Patent Reference 1 cannot surely prevent the deterioration of the dielectric film with the hydrogen. The deterioration of the dielectric film with the hydrogen leads to the decrease of the fabrication yield.

An object of the present invention is to provide a semiconductor device including a capacitor which can be fabricated with high fabrication yield and a method for fabricating the semiconductor device.

[Means for Solving the Problems]

According to one aspect of the present invention, there is provided a semiconductor device comprising: a capacitor formed over a semiconductor substrate and including a lower electrode, a dielectric film formed over the lower electrode and an upper electrode formed over the dielectric film; a first insulation film formed over the semiconductor substrate and the capacitor; a first interconnection formed over the first insulation film and electrically connected to the capacitor; a first hydrogen diffusion preventive film formed over the first insulation film, covering the first interconnection, for preventing the diffusion of hydrogen; a second insulation film formed over the first hydrogen diffusion preventive film and having the surface planarized; a third insulation film formed over the second insulation film; a second interconnection formed over the third insulation film; and a second hydrogen diffusion preventive film formed over the third insulation film, covering the second interconnection, for preventing the diffusion of hydrogen.

According to another aspect of the present invention, there is provided a semiconductor device fabricating method comprising the steps of: forming over a semiconductor substrate a capacitor including a lower electrode, a dielectric film formed over the lower electrode and an upper electrode formed over the dielectric film; forming a first insulation film over the semiconductor substrate and the capacitor; forming a contact hole in the first film down to the capacitor; forming over the first insulation film a first interconnection electrically connected to the capacitor via the contact hole; forming over the first insulation film a first hydrogen diffusion preventive film for preventing the diffusion of hydrogen, covering the first interconnection; forming a second insulation film over the first hydrogen diffusion preventive film; polishing the surface of the second insulation film to planarize the surface of the second insulation film; forming a third insulation film over the second insulation film; forming a second interconnection over the third insulation film; and forming over the third insulation film a second hydrogen diffusion preventive film for preventing the diffusion of hydrogen, covering the second interconnection.

[Effects of the Invention]

As described above, according to the present invention, the second hydrogen diffusion preventive film formed above the capacitors is planarized, whereby the film quality of the second hydrogen diffusion preventive film has very good. According to the present invention, the arrival of hydrogen at the capacitors can be surely prevented by the second hydrogen diffusion preventive film. Thus, according to the present invention, the deterioration of the electric characteristics of the capacitors can be surely prevented, and semiconductor devices of high reliability can be provided with high fabrication yields.

BRIEF DESCRIPTION OF THE DRAWINGS

FIGS. 3A and 3B are sectional views of the semiconductor device according to the first embodiment of the present invention in the steps of the method for fabricating the semiconductor device, which illustrate the method (Part 1).

FIGS. 4A and 4B are sectional views of the semiconductor device according to the first embodiment of the present invention in the steps of the method for fabricating the semiconductor device, which illustrate the method (Part 2).

FIGS. 5A and 5B are sectional views of the semiconductor device according to the first embodiment of the present invention in the steps of the method for fabricating the semiconductor device, which illustrate the method (Part 3).

FIGS. 7A and 7B are sectional views of the semiconductor device according to the first embodiment of the present invention in the steps of the method for fabricating the semiconductor device, which illustrate the method (Part 5).

FIGS. 8A and 8B are sectional views of the semiconductor device according to the first embodiment of the present invention in the steps of the method for fabricating the semiconductor device, which illustrate the method (Part 6).

FIGS. 9A and 9B are sectional views of the semiconductor device according to the first embodiment of the present invention in the steps of the method for fabricating the semiconductor device, which illustrate the method (Part 7).

FIGS. 21A and 21B are sectional views of the semiconductor device according to the second embodiment in the steps of the method for fabricating the semiconductor device, which illustrate the method (Part 2).

FIGS. 24A and 24B are sectional views of the semiconductor device according to the second embodiment in the steps of the method for fabricating the semiconductor device, which illustrate the method (Part 5).

FIGS. 26A and 26B are sectional views of the semiconductor device according to the second embodiment in the steps of the method for fabricating the semiconductor device, which illustrate the method (Part 7).

FIGS. 27A and 27B are sectional views of the semiconductor device according to the second embodiment in the steps of the method for fabricating the semiconductor device, which illustrate the method (Part 8).

DESCRIPTION OF THE REFERENCE NUMBERS

Figure 1:
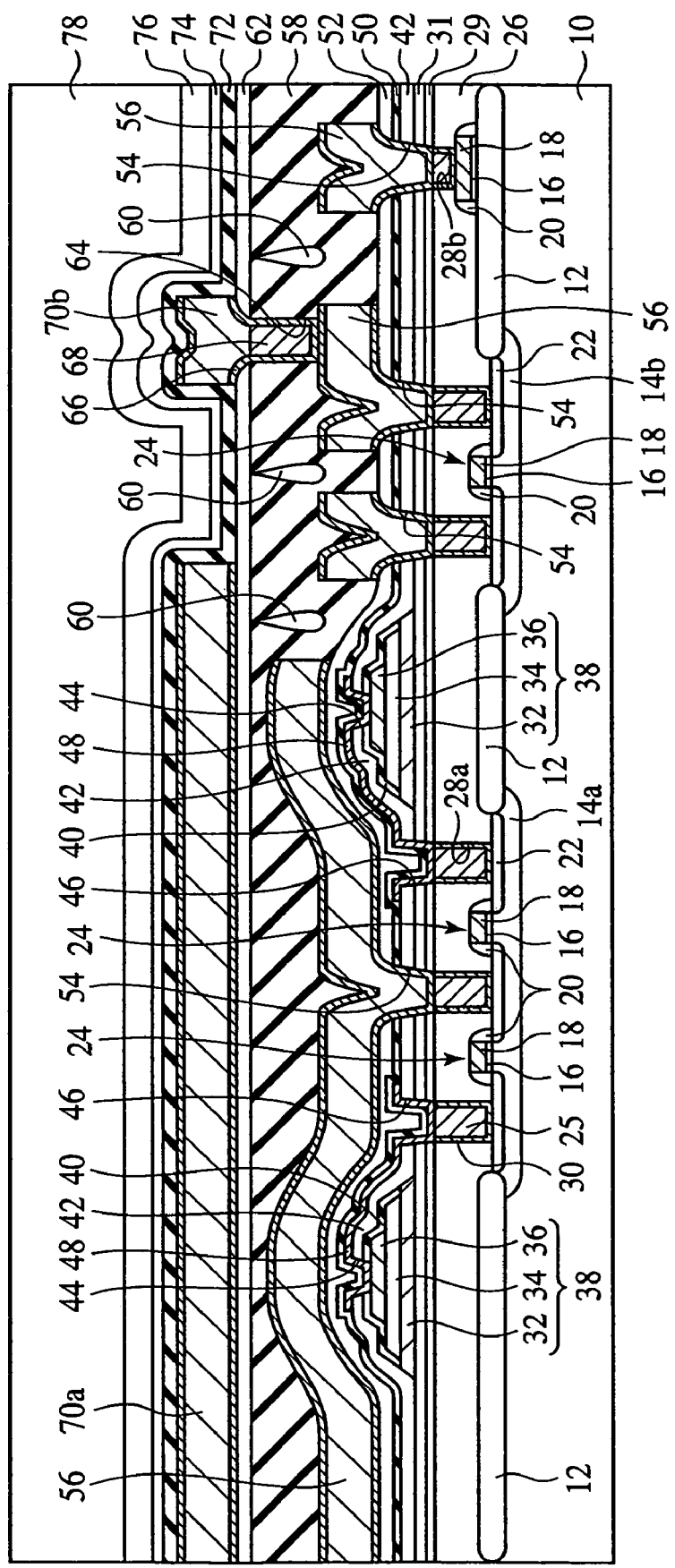
FIG. 1 is a sectional view of the semiconductor device according to a first embodiment of the present invention.

10 . . . semiconductor substrate
12 . . . device isolation region
14a, 14b . . . well
16 . . . gate insulation film
18 . . . gate electrode
20 . . . sidewall insulation film
22 . . . source/drain diffused layer
24 . . . transistor
25 . . . conductor plug
26 . . . inter-layer insulation film
28a, 28b . . . contact hole
29 . . . SiON film
30 . . . barrier metal film
31 . . . silicon oxide film
32 . . . lower electrode
32a . . . Ti film
32b . . . Pt film
32c . . . aluminum oxide film
32d . . . Pt film
34 . . . dielectric film
36 . . . upper electrode
36a . . . $IrO_X$ film
36b . . . Pt film
36c . . . $IrO_X$ film
36d . . . $IrO_Y$ film
36e . . . Pt film
38 . . . capacitor
40 . . . hydrogen diffusion preventive film
42 . . . inter-layer insulation-film
44 . . . contact hole
46 . . . contact hole
48 . . . interconnection
50 . . . hydrogen diffusion preventive film
52 . . . inter-layer insulation film
54 . . . contact hole
56 . . . interconnection
58 . . . inter-layer insulation film
60 . . . void
62 . . . silicon oxide film
64 . . . contact hole
66 . . . barrier metal film
68 . . . conductor plug
70a . . . conduction film
70b . . . interconnection
72 . . . hydrogen diffusion preventive film
74 . . . silicon oxide film
76 . . . silicon oxide film
78 . . . polyimide film
80 . . . photoresist film
82 . . . photoresist film
84 . . . photoresist film
86 . . . AlCu alloy film
88 . . . TiN film
90 . . . hydrogen diffusion preventive film
92 . . . inter-layer insulation film
94 . . . contact hole
96 . . . barrier metal film
98 . . . conductor plug
100 . . . contact hole
102 . . . interconnection
104 . . . hydrogen diffusion preventive film
106 . . . inter-layer insulation film
108 . . . void
110 . . . inter-layer insulation film
112 . . . contact hole
114 . . . barrier metal film
116 . . . conductor plug
118 . . . interconnection
120 . . . hydrogen diffusion preventive film
122 . . . inter-layer insulation film
124 . . . void
126 . . . inter-layer insulation film
128 . . . contact hole
130 . . . barrier metal film
132 . . . conductor plug
134 . . . interconnection
136 . . . hydrogen diffusion preventive film
138 . . . SiON film

BEST MODES FOR THE CARRYING OUT THE INVENTION

A First Embodiment

Figure 2:
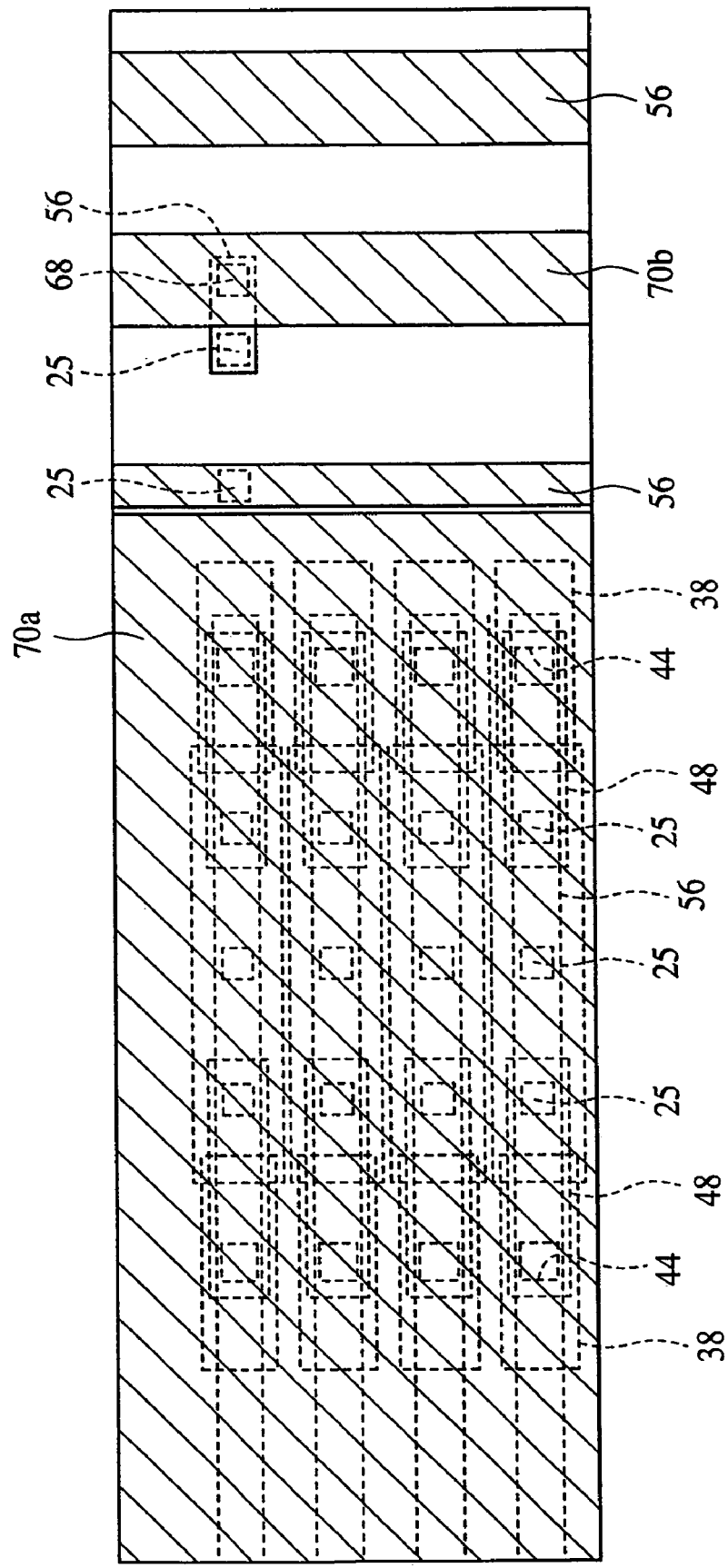
FIG. 2 is a plan view of the semiconductor device according to the first embodiment of the present invention.

The semiconductor device according to a first embodiment of the present invention and the method for fabricating the semiconductor device will be explained with reference to FIGS. 1 to 17. FIG. 1 is a sectional view of the semiconductor device according to the present embodiment. FIG. 2 is a plan view of the semiconductor device according to the present embodiment.

(The Semiconductor Device)

As illustrated in FIG. 1, device isolation regions 12 for defining device regions are formed on a semiconductor substrate 10 of, e.g., silicon. Wells 14a, 14b are formed in the semiconductor substrate 10 with the device isolation regions 12 formed in.

On the semiconductor substrate 10 with the wells 14a, 14b formed in, gate electrodes (gate lines) 18 are formed with a gate insulation film 16 formed therebetween. In the present embodiment, the gate length of the transistor is set at, e.g., 0.5 µm. A sidewall insulation film 20 is formed on the side walls of the gate electrodes 18.

On both sides of the gate electrodes 18 with the sidewall insulation film 20 formed on, a source/drain diffused layer 22 is formed. Thus, transistors 24 each including the gate electrode 18 and the source/drain diffused layer 22 are formed.

On the semiconductor substrate 10 with the transistors 24 formed on, an inter-layer insulation film 26 is formed. The surface of the inter-layer insulation film 26 is planarized.

In the inter-layer insulation film 26, contact holes 28a are formed down to the source/drain diffused layer 22. In the inter-layer insulation film 26, a contact hole 28b is formed down to the gate line (gate electrode) 18.

In the contact holes 28a, 28b, a Ti film of, e.g., a 20 to 60 nm-thickness is formed. In the contact holes with the Ti film formed on, a TiN film of, e.g., a 30 to 50 nm-thickness is formed. The Ti film and the TiN film form a barrier metal film 30.

In the contact holes 28a, 28b with the barrier metal film 30 formed on, contact plugs 25 of tungsten are buried in.

On the inter-layer insulation film 26 with the conductor plugs 25 buried in, an SiON film 29 of, e.g., a 100 nm-thickness is formed.

On the SiON film 29, a silicon oxide film 31 of, e.g., a 130 nm-thickness is formed.

On the silicon oxide film 31, lower electrodes 32 of capacitors 38 are formed. The lower electrodes 32 are formed of the layer film of, e.g., a 20 nm-thickness Ti film and a 175 nm-thickness Pt film.

On the lower electrodes 32, a dielectric film 34 of the capacitors 38 is formed. The dielectric film is formed of a ferroelectric film of, e.g., a 150 nm-thickness. The ferroelectric film is, e.g., $PbZr_{1-x}Ti_xO_3$ (PZT film).

On the dielectric film 34, upper electrodes 36 of the capacitors 38 are formed. The upper electrodes 36 are formed of the layer film of, e.g, a 100 to 300 nm-thickness $IrO_X$ film and a 20 to 100 nm-thickness Pt film. The thickness of the Pt film is set at, e.g., 75 nm.

The Pt film is for decreasing the contact resistance between the interconnections and the upper electrodes 36. The Pt film may not be provided when the contact resistance between the interconnections and the upper electrodes 36 does not have to be very low.

Thus, the capacitors 38 are each formed of the lower electrode 32, the dielectric film 34 and the upper electrode 36.

On the dielectric film 34 and the upper electrodes 36, a hydrogen diffusion preventive film 40 is formed, covering the upper surfaces and the side walls of the dielectric film 34 and the upper electrodes 36. The hydrogen diffusion preventive film 40 is formed of, e.g., aluminum oxide ($Al_2O_3$). The hydrogen diffusion preventive film 40 has the function of preventing the diffusion of hydrogen. If hydrogen arrives at the dielectric film 34 of the capacitors 38, the metal oxide forming the dielectric film 34 is reduced with the hydrogen, and the dielectric film 34 has the electric characteristics deteriorated. The hydrogen diffusion preventive film 40 is formed on the upper surfaces and the side walls of the dielectric film 34 and the upper electrodes 36, whereby the hydrogen is hindered from arriving at the dielectric film 34, and the deterioration of the electric characteristics of the dielectric film 34 can be suppressed.

On the silicon oxide film 31 with the capacitors 38 and the hydrogen diffusion preventive film 40 formed on, an inter-layer insulation film 42 of silicon oxide film of, e.g., a 400 to 500 nm-thickness is formed.

On the inter-layer insulation film 42, contact holes 44 are formed down to the upper electrodes 36. In the inter-layer insulation film 42, contact holes (not illustrated) are formed down to the lower electrodes 32. In the inter-layer insulation film 42, the silicon oxide film 31 and the SiON film 29, contact holes 46 are formed down to the conductor plugs 25.

On the inter-layer insulation film 42 and in the contact holes 44, 46, interconnections 48 are formed. The upper electrodes 36 of the capacitors 38, and the conductor plugs 25 are connected by the interconnections 48. The interconnections 48 are formed of a TiN film of, e.g., a 150 nm-thickness.

On the inter-layer insulation film 42 with the interconnections 48 formed on, a hydrogen diffusion preventive film 50 is formed. The hydrogen diffusion preventive film 50 is aluminum oxide of, e.g., a 20 nm-thickness.

On the hydrogen diffusion preventive film 50, an inter-layer insulation film 52 of a silicon oxide film of, e.g., a 300 nm-thickness is formed.

In the inter-layer insulation film 52, the hydrogen diffusion preventive film 50, the inter-layer insulation film 42, the silicon oxide film 31 and the SiON film 29, contact holes 54 are formed down to the conductor plugs 25.

On the inter-layer insulation film 52 and in the contact holes 54, an interconnection 56 is formed. The interconnection 56 is formed of the layer film of, e.g., a 20 nm-thickness Ti film, a 50 nm-thickness TiN film, a 500 nm-thickness AlCu alloy film, a 10 nm-thickness Ti film and a 100 nm-thickness TiN film.

On the inter-layer insulation film 52 with the interconnections 56 formed in, a silicon oxide film 58 of, e.g., a 2.0 to 2.5 μm-thickness is formed. The surface of the silicon oxide film 58 is planarized. Voids 60 are generated in the upper part of the silicon oxide film 58 above the parts where the gap between the interconnections 56 is smaller.

On the silicon oxide film 58, a silicon oxide film 62 of, e.g., a 100 to 300 nm-thickness is formed. The silicon oxide film 62 is for covering the voids present in the upper part of the silicon oxide film 58. The silicon oxide film 62, which is formed on the planarized silicon oxide film 58, has the surface planarized.

In the inter-layer insulations 56, 62, a contact hole 64 is formed down to the interconnection 56.

In the contact hole 64, a 20 nm-thickness Ti film and a 50 nm-thickness TiN film, for example, are formed. The Ti film and the TiN film form a barrier metal film 66.

In the contact hole 64 with the barrier metal film 66 formed in, a conductor plug 68 of tungsten is buried in.

On the inter-layer insulation films 58, 62 with the conductor plug 68 buried in, a solid conduction film (cover film) 70a and an interconnection 70b are formed. The solid conduction film 70a and the interconnection 70b are formed of one and the same conduction film. The solid conduction film 70a and the interconnection 70b are formed of the layer film of, e.g., a 20 nm-thickness Ti film, a 50 nm-thickness TiN film, a 500 nm-thickness AlCu alloy film, a 100 nm-thickness TiN film. The solid conduction film 70a is present above the capacitors 38. The solid conduction film (cover film) 70a is for preventing information stored in the capacitors 38 from being read at the outside so as to ensure the security. The solid conduction film 70a, which is formed on the planarized inter-layer insulation film 62, has the surface planarized.

On the inter-layer insulation film 62 with the solid conduction film 70a and the interconnection 70b formed on, a hydrogen diffusion preventive film 72 is formed. The hydrogen diffusion preventive film 72 is formed of aluminum oxide of, e.g., a 20 to 50 nm-thickness. Since the hydrogen diffusion preventive film 72 above the capacitor 38 is formed on the planarized conduction film 70a, a part of the hydrogen diffusion preventive film 72 present above the capacitor 38 is planarized.

The reason why the planarized hydrogen diffusion preventive film 72 is positioned above the capacitors 38 is as follows.

That is, the hydrogen diffusion preventive film 72 does not have good coverage at the side walls of the steps and cannot sufficiently prevent the diffusion of hydrogen. In the case that the steps are positioned above the capacitors 38, and the hydrogen diffusion preventive film 72 is formed, covering the steps, the hydrogen diffusion preventive film 72 cannot sufficiently prevent the diffusion of hydrogen at the steps. Resultantly, hydrogen passes through the hydrogen diffusion preventive film 72 formed on the side walls of the steps. Furthermore, the voids 60 are present in the upper part of the inter-layer insulation film 58. The hydrogen which has passed through the hydrogen diffusion preventive film 72 arrives at the dielectric film 34 of the capacitors 38 via the voids 60. When hydrogen arrives at the dielectric film 34 of the capacitors 38, the metal oxide forming the dielectric film 34 is reduced with the hydrogen, and the capacitors 38 have the electric characteristics deteriorated.

In the present embodiment, however, the hydrogen diffusion preventive film 72 is formed on the planarized conduction film 70a above the capacitors 38. Accordingly, the hydrogen diffusion preventive film 72 is planarized above the capacitors 38. The planarized hydrogen diffusion preventive film 72 has very good coverage and can surely barrier hydrogen above the capacitors 38. Thus, according to the present embodiment, the arrival of hydrogen at the dielectric film 34 of the capacitors 38 can be surely prevented. According to the present embodiment, the metal oxide forming the dielectric film 34 of the capacitors 38 is prevented from being reduced with hydrogen, and the deterioration of the electric characteristics of the capacitors 38 can be surely prevented.

For this reason, in the present embodiment, the planarized hydrogen diffusion preventive film 72 is positioned above the capacitors 38.

On the hydrogen diffusion preventive film 72, a silicon oxide film 74 of, e.g., a 200 to 300 nm-thickness is formed.

On the silicon oxide film 74, a silicon nitride film 76 of, e.g., a 500 nm-thickness is formed.

On the silicon nitride film 76, a polyimide resin film 78 of, e.g., a 2 to 10 µm-thickness is formed.

In the polyimide resin film 78, the silicon nitride film 76, the silicon oxide film 74 and the hydrogen diffusion preventive film 72, openings (not illustrated) are formed down to electrode pads (not illustrated).

Thus, the semiconductor device according to the present embodiment is constituted.

The semiconductor device according to the present embodiment is characterized mainly in that the hydrogen diffusion preventive film 72 is planarized above the capacitors 38.

As described above, the hydrogen diffusion preventive film 72 does not have very good coverage on the side walls of the steps, and cannot sufficiently prevent the diffusion of hydrogen. In the case that steps are positioned above the capacitors 38, and the hydrogen diffusion preventive film 72 is formed, covering the steps, the hydrogen diffusion preventive film 72 cannot sufficiently prevent the diffusion of hydrogen at the steps. Then, hydrogen passes through the hydrogen diffusion preventive film 72 at the steps. Besides, voids 60 are present in the upper part of the inter-layer insulation film 58. Then, the hydrogen which has passed through the hydrogen diffusion preventive film 72 arrives at the dielectric film 34 of the capacitors 38 via the voids 60. When hydrogen arrives at the dielectric film 34 of the capacitors 38, the metal oxide forming the dielectric film 34 is reduced with the hydrogen, and the electric characteristics of the capacitors 38 are deteriorated.

In the present embodiment, however, a part of the hydrogen diffusion preventive film 72 present above the capacitor 38 is planarized, because the part is formed on the planarized conduction film 70a. Accordingly, the part of the hydrogen diffusion preventive film 72 positioned above the capacitor 38 has very good coverage. Thus, above the capacitors 38, the hydrogen diffusion preventive film 72 can surely prevent the diffusion of hydrogen to the capacitors 38. According to the present embodiment, the arrival of hydrogen at the capacitors 38 can be surely prevented, and the deterioration of the electric characteristics of the capacitors can be surely prevented. The semiconductor device according to the present embodiment can have high production yields.

Patent Reference 1 discloses the technique of forming an aluminum oxide film on the inter-layer insulation film formed on the capacitors. In Patent Reference 1, the surface of the inter-layer insulation film is not planarized, and the aluminum oxide film is not planarized above the capacitors. Accordingly, the aluminum oxide film does not have good coverage.

Thus, in Patent Reference 1, in forming an SiN film is formed by plasma CVD after the aluminum oxide film has been formed, hydrogen arrives at the dielectric film of the capacitors, and the dielectric film of the capacitors is reduced with hydrogen. It is difficult to fabricate the semiconductor device of high reliability with high yields by using the technique disclosed in Patent Reference 1.

(The Method for Fabricating the Semiconductor Device)

Next, the method for fabricating the semiconductor device according to the present embodiment will be explained with reference to FIGS. 3A to 17. FIGS. 3A to 17 are sectional views of the semiconductor device according to the present embodiment in the steps of the method for fabricating the semiconductor device, which illustrate the method.

First, as illustrated in FIG. 3A, device isolation regions 12 for defining device regions are formed on the semiconductor substrate 10 of, e.g., silicon by LOCOS (LOCal Oxidation of Silicon).

Next, a dopant impurity is implanted by ion implantation to form the wells 14a, 14b.

Next, the 9 nm-thickness gate insulation film 16 is formed on the device regions by, e.g., thermal oxidation.

Next, the 120 nm-thickness polysilicon film 18 is formed by, e.g., CVD. The polysilicon film 18 is to be the gate electrodes, etc.

Next, the polysilicon film 18 is patterned by photolithography. Thus, as illustrated in FIG. 3B, the gate electrodes (gate lines) 18 of the polysilicon film are formed. The gate length is, e.g., 0.5 µm.

Next, with the gate electrodes 18 as the mask, a dopant impurity is implanted in the semiconductor substrate 10 on both sides of the gate electrodes 18. Thus, extension regions (not illustrated) forming the shallow regions of the extension sources/drains are formed.

Next, the 150 nm-thickness silicon oxide film 20 is formed on the entire surface by, e.g., CVD.

Next, the silicon oxide film 20 anisotropically etched. Thus, the sidewall insulation film 20 of the silicon oxide film is formed on the side walls of the gate electrodes 18.

Next, with the gate electrodes 18 with the sidewall insulation film 20 formed on, a dopant impurity is implanted into the semiconductor substrate on both sides of the gate electrodes 18 by ion implantation. Thus, an impurity diffused layer (not illustrated) forming the deep regions of the extension sources/drains. The extension regions and the deep impurity diffused layer form the source/drain diffused layer 22.

Thus, as illustrated in FIG. 4A, transistors 24 each including the gate electrode 18 and the source/drain diffused layer 22 are formed.

Then, the SiON film of, e.g., a 200 nm-thickness and the silicon oxide film of a 1000 nm-thickness are sequentially laid. The SiON film and the silicon oxide film form the inter-layer insulation film 26.

Next, the surface of the inter-layer insulation film 26 is planarized by, e.g., CMP (see FIG. 4B).

Next, as illustrated in FIG. 5A, by photolithography the contact holes 28a and the contact hole 28b are formed in the inter-layer insulation film 26 respectively down to the source/drain diffused layer 22 and down to the gate electrode (gate line) 18.

Then, the 20 to 60 nm-thickness Ti film is formed on the entire surface by, e.g., sputtering.

Next, the 30 to 50 nm-thickness TiN film is formed on the entire surface by, e.g., sputtering or CVD. The Ti film and TiN film form the barrier metal film 30.

Next, the 500 nm-thickness tungsten film 25 is formed on the entire surface by, e.g., CVD.

Next, the tungsten film and the barrier metal film 30 are polished by CMP until the surface of the inter-layer insulation film 26 is exposed. Thus, the conductor plugs 25 of the tungsten are buried in the contact holes 28a, 28b (see FIG. 5B).

Figure 6A:
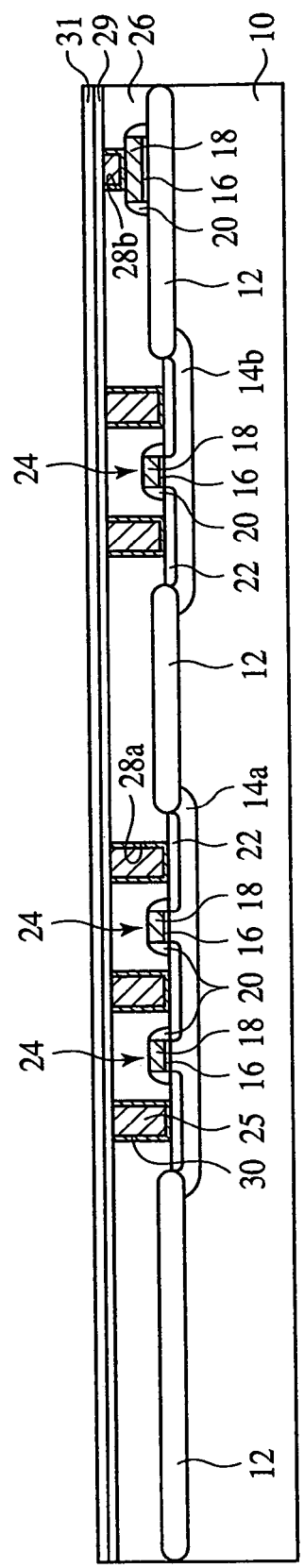
FIGS. 6A and 6B are sectional views of the semiconductor device according to the first embodiment of the present invention in the steps of the method for fabricating the semiconductor device, which illustrate the method (Part 4).

Next, as illustrated in FIG. 6A, the 100 nm-thickness SiON film 29 is formed on the entire surface by, e.g., plasma CVD.

Next, the 130 nm-thickness silicon oxide film 31 is formed on the entire surface by, e.g., plasma TEOS CVD.

Next, thermal processing is made in a nitrogen ($N_2$) atmosphere. The thermal processing temperature is, e.g., 650° C., and the thermal processing period of time is, e.g., 30 minutes.

Figure 6B:
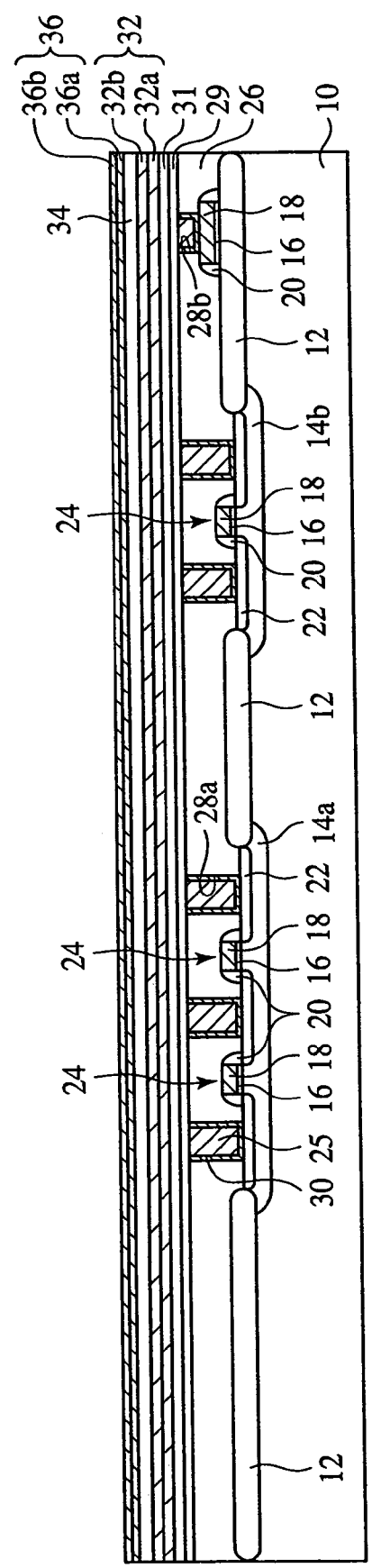

Next, as illustrated in FIG. 6B, the 20 nm-thickness Ti film 32a is formed on the entire surface by, e.g., sputtering.

Next, the 175 nm-thickness Pt film 32b is formed on the entire surface by, e.g., sputtering. Preferably, the Ti film 32a and the Pt film 32b are formed uninterruptedly without being exposed to the atmospheric atmosphere. Thus, the layer film 32 of the Ti film 32a and the Pt film 32b is formed. The layer film 32 is to be the lower electrodes of the capacitors 38.

Then, the dielectric film 34 is formed on the entire surface by, e.g., sputtering. The dielectric film 34 is formed of, e.g., a ferroelectric film. More specifically, a PTZ film of, e.g., a 150 nm-thickness is formed.

The ferroelectric film forming the dielectric film 34 is formed by sputtering here but is not formed essentially by sputtering. The ferroelectric film may be formed by, e.g., sol-gel process, MOD (Metal Organic Deposition), MOCVD or others.

Next, thermal processing is made in an oxygen atmosphere by, e.g., RTA (Rapid Thermal Annealing). The thermal processing temperature is, e.g., 650-800° C., and the thermal processing period of time is, e.g., 30 to 300 seconds. More specifically, thermal processing is made in an atmosphere containing oxygen by 2.5% at 600° C. for 90 seconds, and then, thermal processing is made in an atmosphere containing oxygen by 100% at 750° C. for 160 seconds.

Next, the 100 to 300 nm-thickness $IrO_X$ film 36a is formed by, e.g., sputtering or MOCVD.

Next, the 20 to 100 nm-thickness Pt film 36b is formed by, e.g., sputtering or MOCVD. The thickness of the Pt film 36b is 75 nm here. The film forming temperature of the Pt film 36b is, e.g., 450° C. Thus, the layer film 36 of the $IrO_X$ film 36a and the Pt film 36b is formed. The layer film 36 is to be the upper electrodes.

The Pt film 36b prevents the reduction of the surfaces of the upper electrodes 36 to decrease the contact resistance between the interconnection 48 and the upper electrodes 36. Unless the contact resistance between the interconnection 48 and the upper electrodes 36 is much decreased, the Pt film 36b may not be formed.

Next, a photoresist film 80 is formed on the entire surface by spin coating.

Next, the photoresist film 80 is patterned into plane shape of the upper electrodes by photolithography.

Then, with the photoresist film 80 as the mask, the layer film 36 is etched. The etching gas is Ar gas and $Cl_2$ gas. Thus, the upper electrodes 36 are formed of the layer film (see FIG. 7A). Then, the photoresist film 80 is released.

Next, thermal processing is made by RTA in an oxygen atmosphere at 650° C. or above for 1 to 3 minutes, for example. This thermal processing is for preventing the occurrence of abnormalities in the surface of the upper electrodes 36.

Then, thermal processing is made in an oxygen atmosphere at 650° C. for 60 minutes, for example. This thermal processing is for improving the film quality of the dielectric film 34.

Next, a photoresist film 82 is formed on the entire surface by spin coating.

Next, the photoresist film 82 is patterned into the plane shape of the dielectric film of the capacitors 38 by photolithography.

Next, with the photoresist film 82 as the mask, the dielectric film 34 is etched (see FIG. 7B). Then, the photoresist film 82 is released.

Next, thermal processing is made in an oxygen atmosphere at 350° C. for 60 minutes, for example.

Next, as illustrated in FIG. 8A, the hydrogen diffusion preventive film 40 is formed by, e.g., sputtering or CVD. As the hydrogen diffusion preventive film 40, the 20 to 150 nm-thickness aluminum oxide film 40 is formed.

MOCVD can form the hydrogen diffusion preventive film 40 of good step coverage but damages the hydrogen diffusion preventive film 40 with hydrogen. Accordingly, it is not preferable to use MOCVD to form the hydrogen diffusion preventive film 40.

Next, a photoresist film 84 is formed on the entire surface by spin coating.

Next, the photoresist film 84 is patterned into the plane shapes of the lower electrodes 32 of the capacitors by photolithography.

Next, with the photoresist film 84 as the mask, the hydrogen diffusion preventive film 40 and the layer film are etched (see FIG. 8B). Thus, the lower electrodes of the layer film are formed. The hydrogen diffusion preventive film 40 is left, covering the upper electrodes and the dielectric film 34. Then, the photoresist film 84 is released (see FIG. 9A).

Next, as illustrated in FIG. 9B, the silicon oxide film 42 of, e.g., a 400-500 nm-thickness is formed on the entire surface by plasma TEOS CVD. The raw material gases are, e.g., TEOS gas, oxygen gas and helium gas.

Then, an SOG (Spin On Glass) film of, e.g., a 100 nm-thickness (not illustrated) is formed spin coating.

Next, the entire surface of the layer film of the silicon oxide film 42 and the SOG film is etched back by, e.g., about 200 nm. The etching-back is made, completely removing the SOG film. The SOG film is completely etched back because when the SOG film remains on the silicon oxide film 42, there is a risk that water contained in the SOG film may deteriorate the dielectric film 34 of the capacitors 38. Thus, the steps present on the surface of the inter-layer insulation film 42 are mitigated.

Then, thermal processing is made in a plasma atmosphere generated with $N_2O$ gas (plasma processing). This thermal processing is for removing water present on the surface of the inter-layer insulation film 42 and inside the inter-layer insulation film 42 and also improving the film quality of the inter-layer insulation film 42. The substrate temperature at the time of the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

Figure 10A:
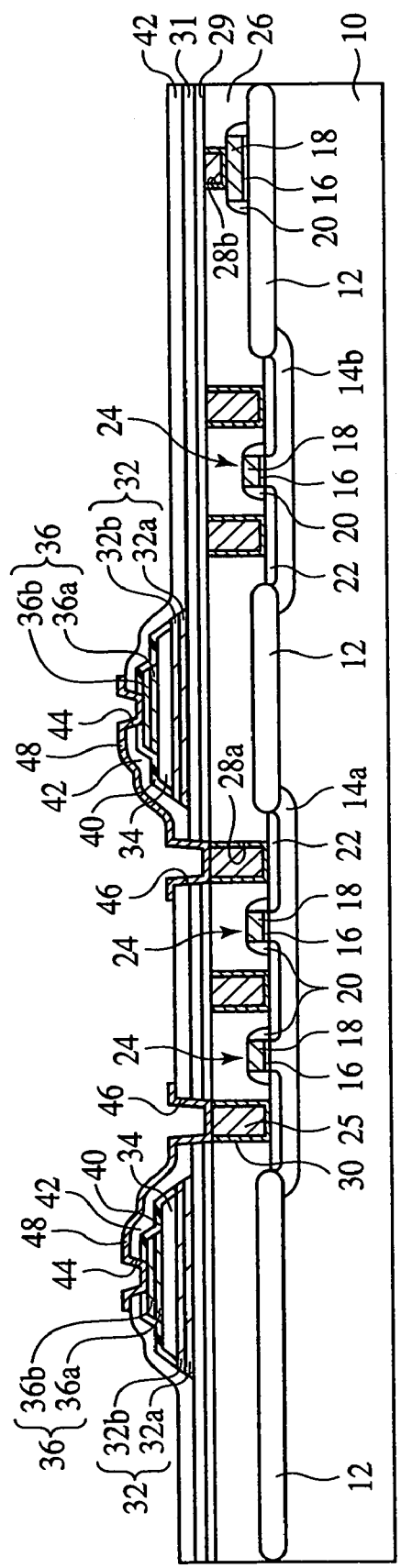
FIGS. 10A and 10B are sectional views of the semiconductor device according to the first embodiment of the present invention in the steps of the method for fabricating the semiconductor device, which illustrate the method (Part 8).

Then, as illustrated in FIG. 10A, by photolithography, in the inter-layer insulation film 42, the contact holes 44 and the contact holes (not illustrated) are formed respectively down to the upper electrodes 36 and down to the lower electrodes 32.

Then, thermal processing is made. This thermal processing is for supplying oxygen to the dielectric film of the capacitors to recover the electric characteristics of the capacitors. The substrate temperature for the thermal processing is, e.g., 550° C. The gas to be introduced into the chamber is, e.g., a gas containing oxygen by 100%. The thermal processing period of time is, e.g., 60 minutes.

Next, in the inter-layer insulation film 42, the silicon oxide film 31 and the SiON film 29, the contact holes 46 are formed down to the conductor plugs 25.

Then, plasma cleaning using argon gas is made. This cleaning removes natural oxide films, etc. present on the surfaces of the conductor plugs 25. The conditions for the plasma cleaning are so set that the thermal oxide film, for example, can be removed by 10 nm.

Next, the TiN film of, e.g., a 150 nm-thickness is formed on the entire surface.

Then, the TiN film is patterned by photolithography. Thus, the interconnections 48 for interconnecting the upper electrodes 36 of the capacitors 38 and the conductor plugs 25 are formed.

Then, thermal processing is made. The substrate temperature for the thermal processing is, e.g., 350° C. The gas to be introduced into the chamber is, e.g., $N_2$ gas. The thermal processing period of time is, e.g., 30 minutes.

Figure 10B:
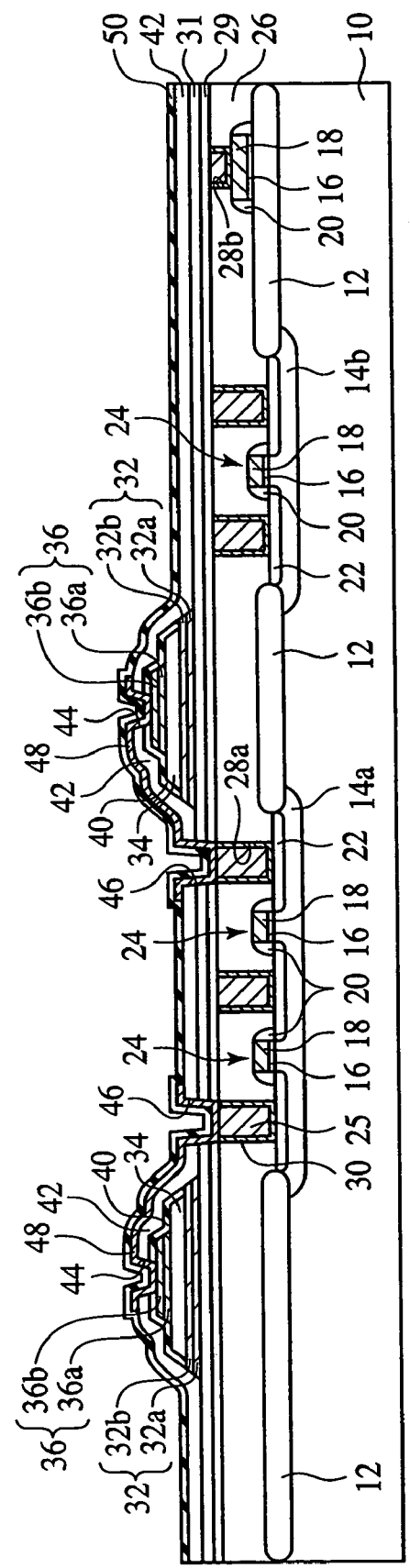

Then, as illustrated in FIG. 10B, the hydrogen diffusion preventive film 50 is formed on the entire surface by, e.g., sputtering or CVD. As the hydrogen diffusion preventive film 50, an aluminum oxide film of, e.g., a 20 nm-thickness is formed.

Figure 11:
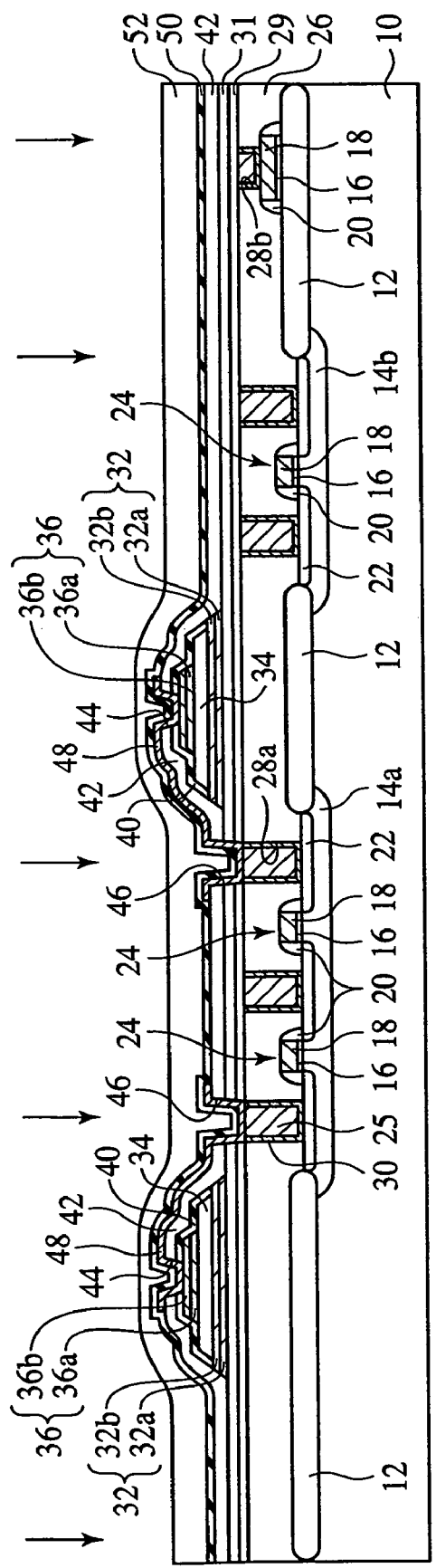
FIG. 11 is a sectional view of the semiconductor device according to the first embodiment of the present invention in the steps of the method for fabricating the semiconductor device, which illustrates the method (Part 9).

Then, as illustrated in FIG. 11, the inter-layer insulation film 52 of a silicon oxide film of, e.g., a 300 nm-thickness is formed on the entire surface by plasma TEOS CVD.

Then, thermal processing is made in a plasma atmosphere generated by using $N_2O$ gas. This thermal processing is for removing water in the inter-layer insulation film 52 and also improving the film quality of the inter-layer insulation film 52. The substrate temperature for the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

Figure 12:
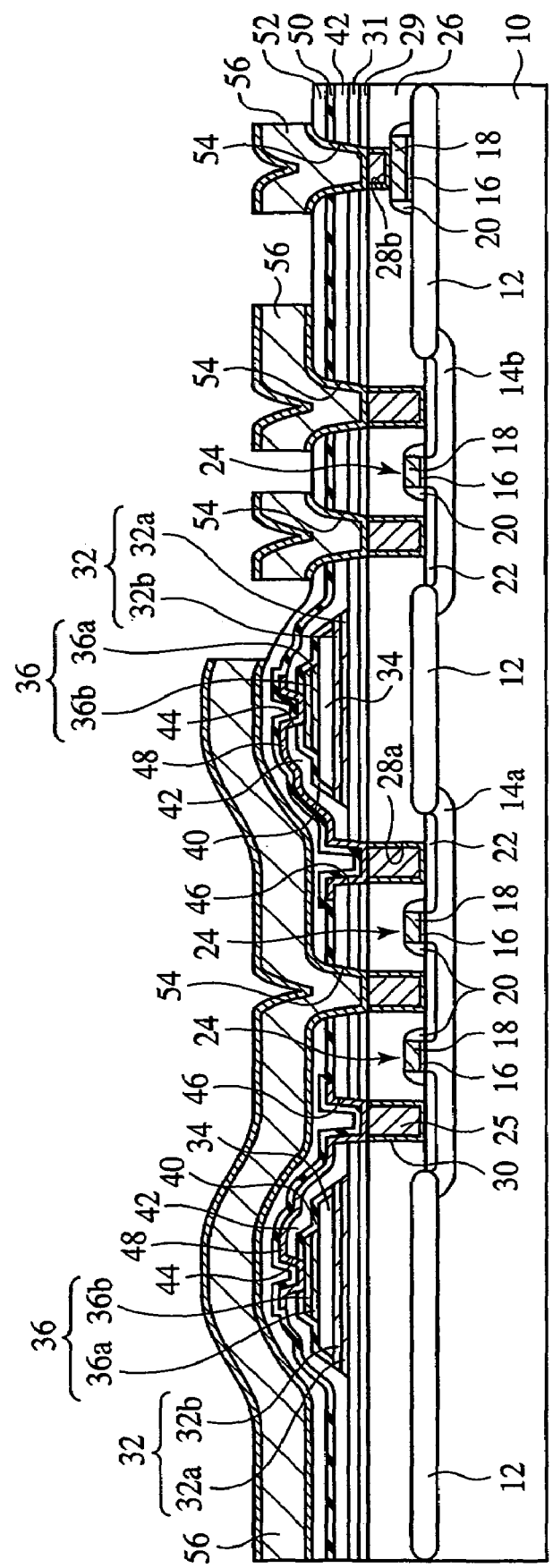
FIG. 12 is a sectional view of the semiconductor device according to the first embodiment of the present invention in the steps of the method for fabricating the semiconductor device, which illustrates the method (Part 10).

Then, as illustrated in FIG. 12, the contact holes 54 and the contact holes (not illustrated) are formed respectively down to the conductor plugs 25 and down to the conductor plugs (not illustrated) formed in the peripheral circuit region (not illustrated).

Next, plasma cleaning using argon is made. This plasma cleaning removes natural oxide films, etc. present on the surfaces of the conductor plugs. The conditions for the plasma cleaning are so set that the thermal oxide film can be removed by 20 nm.

Next, the 20 nm-thickness Ti film, the 50 nm-thickness TiN film, the 500 nm-thickness AlCu alloy film, the 10 nm-thickness Ti film and the 100 nm-thickness TiN film are sequentially laid one on another. Thus, the layer film 56 of the Ti film, the TiN film, the AlCu film, the Ti film and the TiN film is formed.

Then, the layer film 56 is patterned by photolithography. Thus, the interconnections 56 are formed of the layer film.

Figure 13:
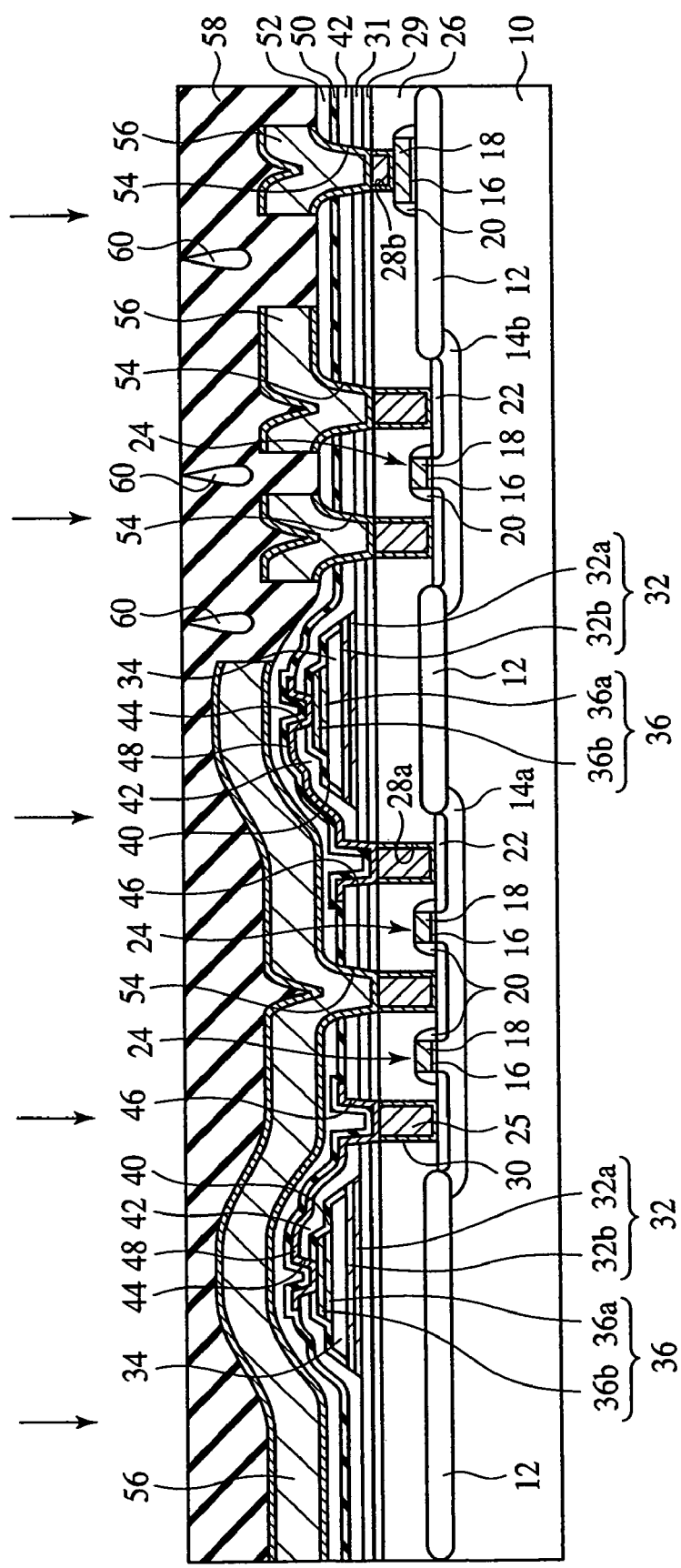
FIG. 13 is a sectional view of the semiconductor device according to the first embodiment of the present invention in the steps of the method for fabricating the semiconductor device, which illustrates the method (Part 11).

Next, as illustrated in FIG. 13, the silicon oxide film 58 of, e.g., a 2.0-2.5 µm-thickness is formed by plasma TEOS CVD. The raw material gas is, e.g., a mixed gas of TEOS gas, oxygen gas and helium gas.

Next, the surface of the silicon oxide film 58 is planarized by, e.g., CMP. The voids 60 remains in the upper part of the silicon oxide film 58 above the regions where the gap between the interconnections 56 is small.

Then, thermal processing is made in a plasma atmosphere generated by using $N_2O$ gas. This thermal processing is for removing water in the silicon oxide film 58 and also improving the film quality of the silicon oxide film 58. The substrate temperature for the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

Figure 14:
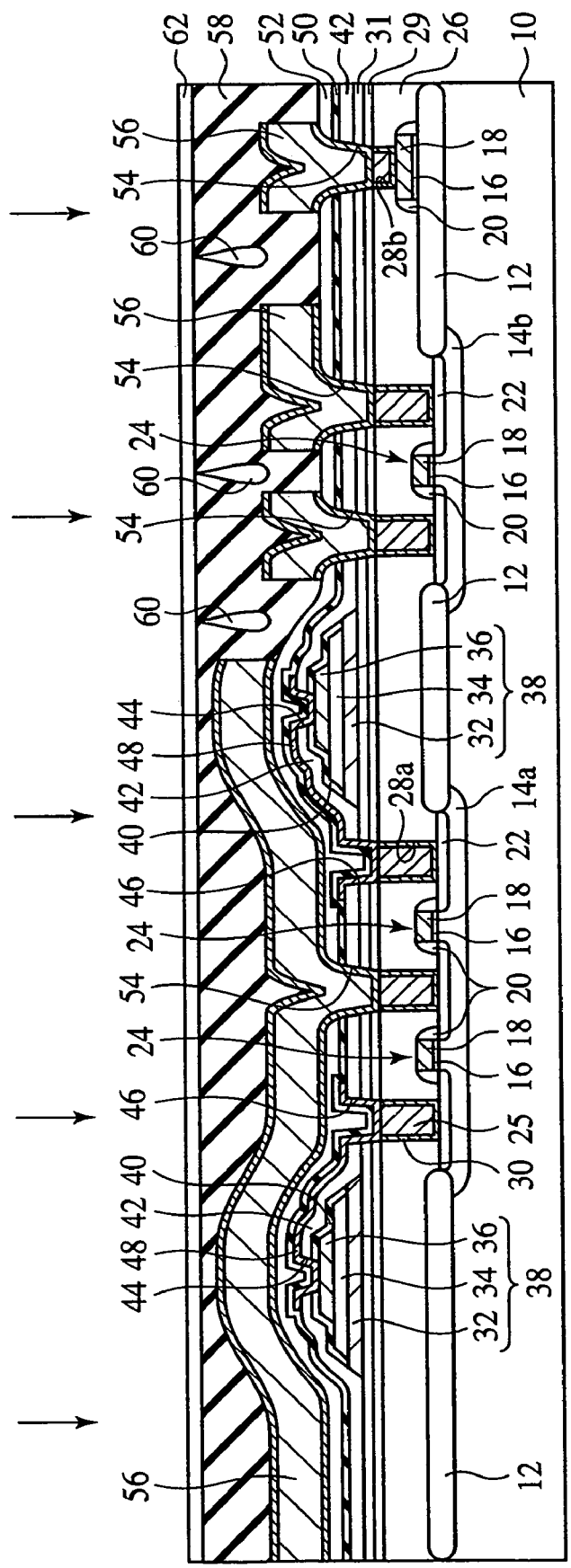
FIG. 14 is a sectional view of the semiconductor device according to the first embodiment of the present invention in the steps of the method for fabricating the semiconductor device, which illustrates the method (Part 12).

Then, as illustrated in FIG. 14, the 100 to 300 nm-thickness silicon oxide film 62 is formed on the entire surface by plasma TEOS CVD. The raw material gas is, e.g., a mixed gas of TEOS gas, oxygen gas and helium gas. The silicon oxide film 62 is for covering the voids 60 present in the upper part of the silicon oxide film 58. The silicon oxide film 62, which has been formed on the planarized silicon oxide film 58, is formed flat.

Figure 15:
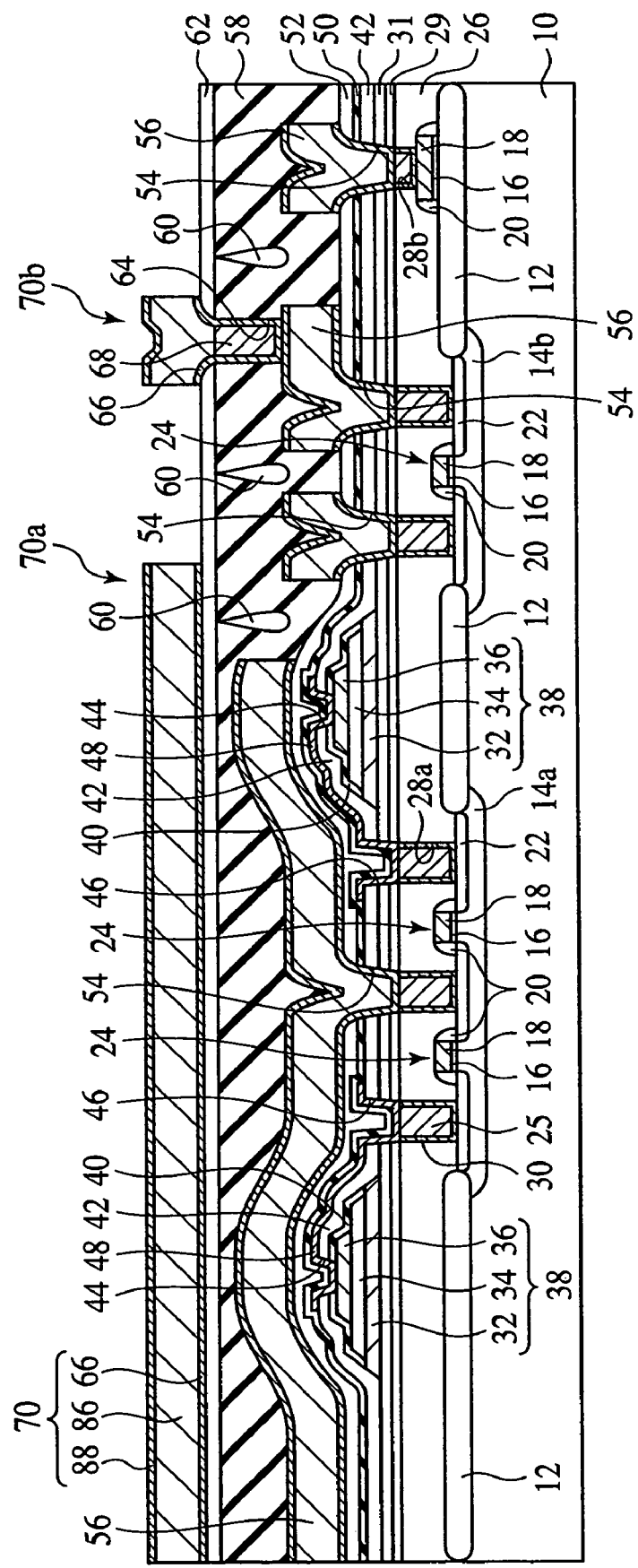
FIG. 15 is a sectional view of the semiconductor device according to the first embodiment of the present invention in the steps of the method for fabricating the semiconductor device, which illustrates the method (Part 13).

Then, as illustrated in FIG. 15, the contact hole 64 is formed in the inter-layer insulation films 58, 62 down to the interconnection 56.

Next, plasma cleaning using argon gas is made. This plasma cleaning removes natural oxide film, etc. present on the surface of the interconnection 56. The conditions for the plasma cleaning are so set that, for example, the thermal oxide film can be removed by 20 nm.

Then, the 20 nm-thickness Ti film and the 50 nm-thickness TiN film are sequentially formed by, e.g., sputtering. The Ti film and the TiN film form the barrier metal film 66.

Then, the 650 nm-thickness tungsten film 68 is formed by, e.g., CVD.

Then, the tungsten film 68 except the inside of the contact hole 64 is etched back to removed.

Then, the 500 nm-thickness AlCu alloy film 86 and the 100 nm-thickness TiN film 88 are sequentially formed on the entire surface by, e.g., sputtering. Thus, the layer film 70 of the barrier metal film 66 and the AlCu alloy film 86 and the TiN film 88 is formed.

Next, the layer film 70 is patterned by photolithography. Thus, the solid conduction film 70a and the interconnection 70b of the layer film 70 are formed.

Figure 16:
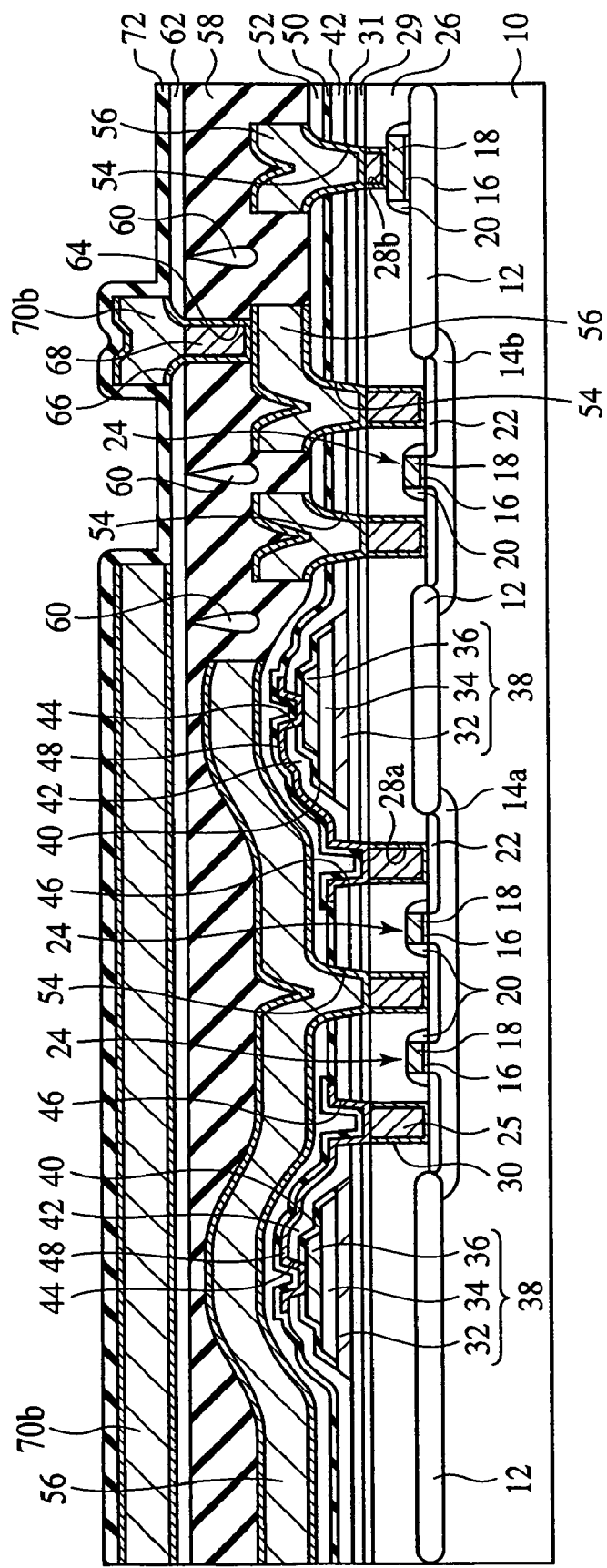
FIG. 16 is a sectional view of the semiconductor device according to the first embodiment of the present invention in the steps of the method for fabricating the semiconductor device, which illustrates the method (Part 14).

Next, as illustrated in FIG. 16, the hydrogen diffusion preventive film 72 is formed on the entire surface by, e.g., sputtering or CVD. As the hydrogen diffusion preventive film 72, an aluminum oxide film of, e.g., a 50 m-thickness is formed.

Figure 17:
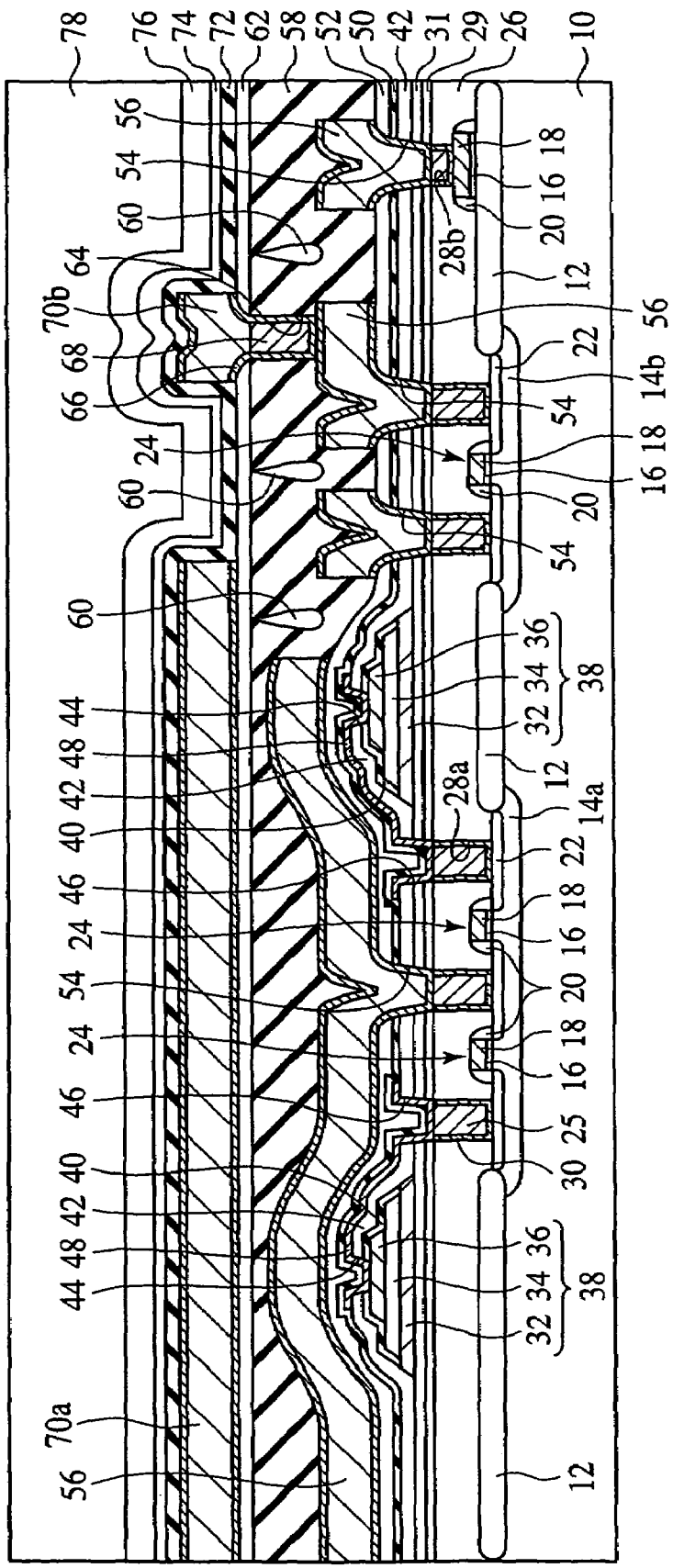
FIG. 17 is a sectional view of the semiconductor device according to the first embodiment of the present invention in the steps of the method for fabricating the semiconductor device, which illustrates the method (Part 15).

Then, as illustrated in FIG. 17, the 200 to 300 nm-thickness silicon oxide film 74 is formed by plasma TEOS CVD.

Next, thermal processing is made in a plasma atmosphere generated by using $N_2O$ gas. This thermal processing is for removing water in the silicon oxide film 74 and also improving the film quality of the silicon oxide film 74. The substrate temperature for the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

Then, the 500 nm-thickness silicon nitride film 76 is formed by, e.g., CVD. The silicon nitride film 76 is for blocking water to prevent the corrosion of the interconnections 56, etc. with water. The processing of the step of forming the silicon nitride film 76 tends to damage the capacitors 38 with hydrogen, but because of the planarized hydrogen diffusion preventive film 72 present above the capacitors 38, the arrival of hydrogen at the dielectric film 34 of the capacitors 38 can be surely prevented.

Then, by photolithography, openings (not illustrated) are formed in the silicon nitride film 76, the silicon oxide film 74 and the hydrogen diffusion preventive film 72 are formed.

Next, the polyimide film 78 of, e.g., a 2 to 10 μm-thickness is formed by, e.g., spin coating.

Next, by photolithography, openings (not illustrated) are formed in the polyimide film 78 down to the electrode pads (not illustrated).

Thus, the semiconductor device according to the present embodiment is fabricated.

(Modification)

Figure 18:
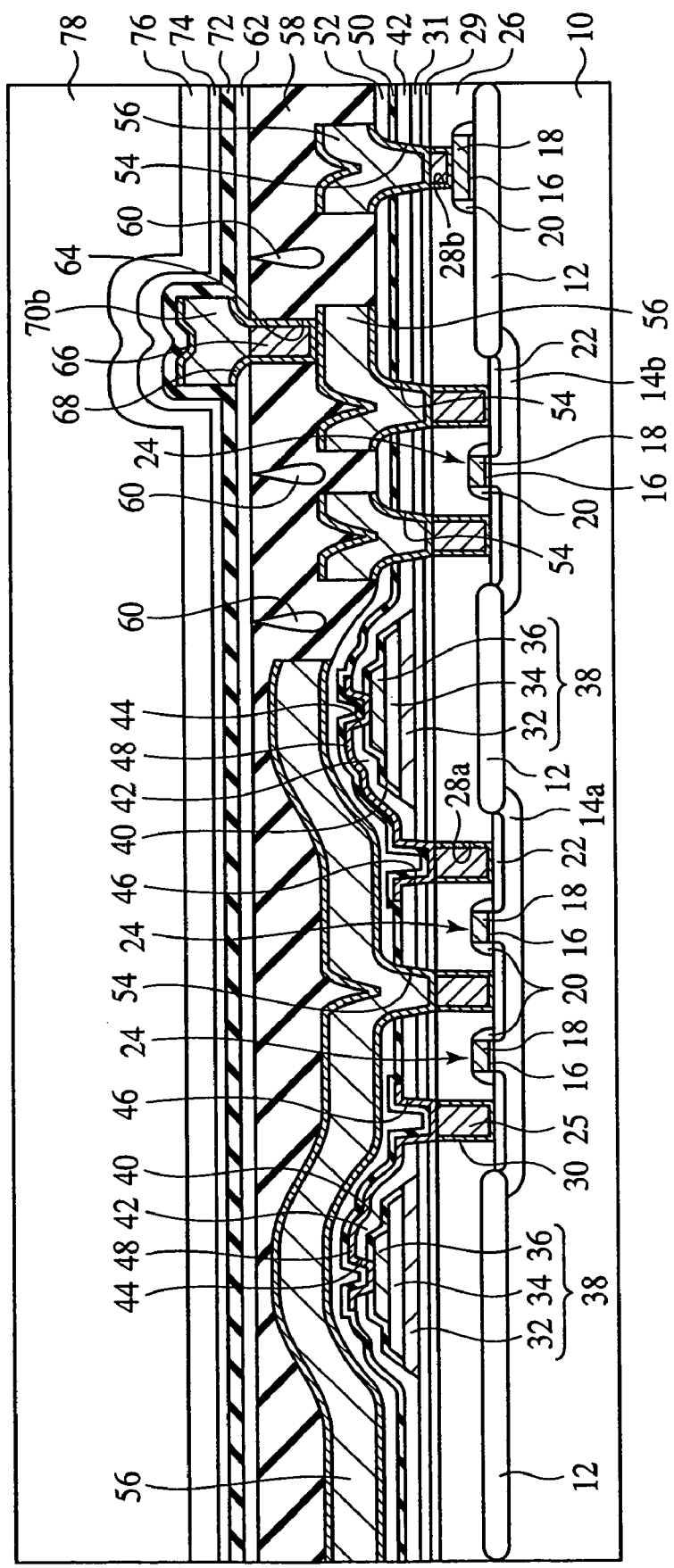
FIG. 18 is a sectional view of the semiconductor device according to the semiconductor device according to a modification of the present invention.

Next, the semiconductor device according to one modification of the present embodiment will be explained with reference to FIG. 18. FIG. 18 is a sectional view of the semiconductor device according to the present modification.

The semiconductor device according to the present modification is characterized mainly in that the solid conduction film 70a is absent above the capacitors 38, and the hydrogen diffusion preventive film 72 is formed on the planarized inter-layer insulation film 62.

As illustrated in FIG. 18, in the present modification, the solid conduction film 70a (see FIG. 1) is absent.

The silicon oxide film 62, which is formed on the planarized silicon oxide film 58, is planarized. Because of the hydrogen diffusion preventive film 72 formed on the planarized silicon oxide film 62, the hydrogen diffusion preventive film 72 formed on the silicon oxide film 62 is planarized. Since the planarized part of the hydrogen diffusion preventive film 72 has good coverage, it is possible to barrier hydrogen surely.

In the present modification as well, the planarized part of the hydrogen diffusion preventive film 72 is positioned above the capacitors 38, whereby the arrival of hydrogen at the dielectric film 34 of the capacitors 38 can be surely prevented. Thus, the present modification can also prevent the metal oxide forming the dielectric film 34 of the capacitors 38 from being reduced with hydrogen, and the deterioration of the electric characteristics of the capacitors 38 can be surely prevented.

A Second Embodiment

Figure 19:
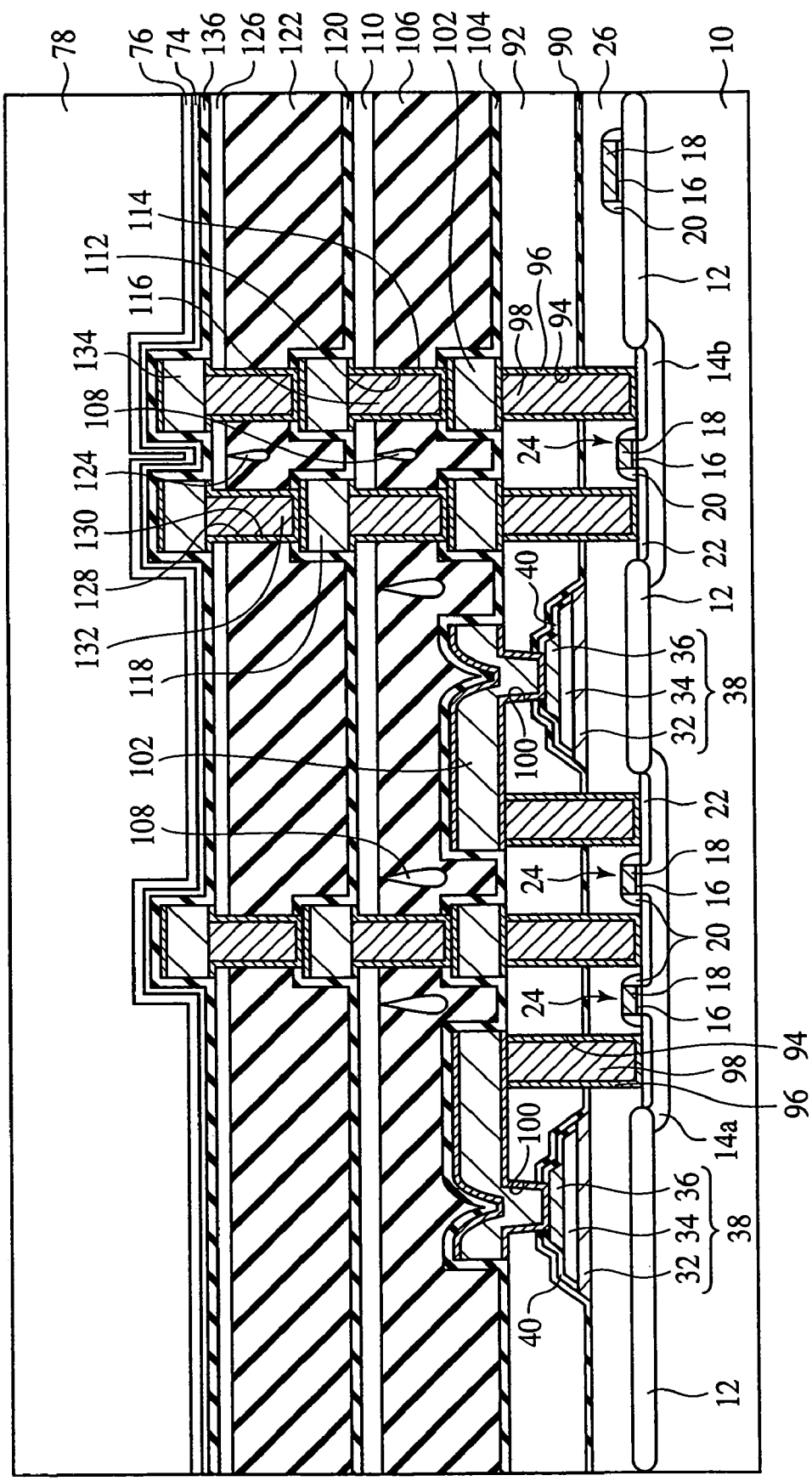
FIG. 19 is a sectional view of the semiconductor device according to a second embodiment of the present invention.

The semiconductor device according to a second embodiment of the present invention and the method for fabricating the semiconductor device will be explained with reference to FIGS. 19 to 41. FIG. 19 is a sectional view of the semiconductor device according to the present embodiment. The same members of the present embodiment as those of the semiconductor device according to the first embodiment and the method for fabricating the semiconductor device illustrated in FIGS. 1 to 18 are represented by the same reference numbers not to repeat or to simplify their explanation.

(The Semiconductor Device)

As illustrated in FIG. 19, on a semiconductor substrate 10 with transistors 24 formed on, an inter-layer insulation film 26 is formed. The gate length of the transistors 24 is, e.g., 0.35 μm.

On the inter-layer insulation film 26, capacitors 38 each including a lower electrode 32, a dielectric film 34 and an upper electrode 36 are formed.

On the upper electrodes 36 and the dielectric film 34, a hydrogen diffusion preventive film 40 is formed, covering the upper surfaces and the side walls of the upper electrodes 36 and the dielectric film 34. The hydrogen diffusion preventive film 40 is an aluminum oxide film of, e.g., a 20 to 150 nm-thickness.

On the capacitors 38 covered with the hydrogen diffusion preventive film 40 and on the inter-layer insulation film 26, a hydrogen diffusion preventive film 90 is formed. The hydrogen diffusion preventive film 90 is an aluminum oxide film of, e.g., a 20 to 50 nm-thickness.

On the hydrogen diffusion preventive film 90, an inter-layer insulation film 92 of, e.g., a 1000 nm-thickness is formed. The surface of the inter-layer insulation film 92 is planarized.

Contact holes 94 are formed in the inter-layer insulation film 92, the hydrogen diffusion preventive film 90 and the inter-layer insulation film 26 down to a source/drain diffused layer 22.

In the contact holes 94, a barrier metal film 96 of a Ti film and a TiN film sequentially laid one on the other is formed.

In the contact holes 94 with the barrier metal film 96 formed in, conductor plugs 98 of tungsten are buried.

In the inter-layer insulation film 92 and the aluminum oxide films 40, 90, contact holes 100 are formed down to the upper electrodes 36 of the capacitors 38.

In the contact holes 100 and on the conductor plugs 98 and the inter-layer insulation film 92, interconnections 102 are formed.

On the inter-layer insulation film 92 with the interconnections 102 formed on, a hydrogen diffusion preventive film 104 is formed, covering the interconnections 102. The hydrogen diffusion preventive film 104 is an aluminum oxide film of, e.g., a 20 to 100 nm-thickness.

On the hydrogen diffusion preventive film 104, a silicon oxide film 106 is formed. The surface of the silicon oxide film 106 is planarized. Voids 108 are present in the upper part of the silicon oxide film 106 above the region where the gap between the interconnections 102 is small.

On the silicon oxide film 106, a silicon oxide film 110 is formed. Since the silicon oxide film 110 is formed on the planarized silicon oxide film 106, the silicon oxide film 110 is planarized.

Contact holes 112 are formed in the inter-layer insulation films 106, 110 down to the interconnections 102.

In the contact holes 112, a barrier metal film 114 of a Ti film and a TiN film sequentially laid one on the other is formed.

In the contact holes 112 with the barrier metal film 114 formed in, conductor plugs 116 of tungsten are buried.

On the inter-layer insulation films 106, 110 with the conductor plugs 116 buried in, interconnections 18 are formed.

On the inter-layer insulation film 110, a hydrogen diffusion preventive film 120 is formed, covering the interconnections 118. The hydrogen diffusion preventive film 120 is, e.g., aluminum oxide film. A part of the hydrogen diffusion preventive film 120 present above the capacitors 38 is planarized. The reason why the planarized part of the hydrogen diffusion preventive film 120 present above the capacitors 38 is that the arrival of hydrogen at the capacitors 38 can be surely prevented by the hydrogen diffusion preventive film 120 as described above.

On the hydrogen diffusion preventive film 120, a silicon oxide film 122 is formed. The surface of silicon oxide film 122 is planarized. A void 124 is present in the upper part of the silicon oxide film 122 above the region where the gap between the interconnections 118 is small.

On the silicon oxide film 122, a silicon oxide film 126 is formed. Since the silicon oxide film 126 is formed on the planarized silicon oxide film 122, the silicon oxide film 122 is planarized.

In the inter-layer insulation films 122, 126, contact holes 128 are formed down to the interconnections 118.

In the contact holes 128, a barrier film 130 of a Ti film and a TiN film sequentially laid one on the other is formed.

In the contact holes 128 with the barrier metal film 130 formed in, conductor plugs 132 of tungsten are buried.

On the inter-layer insulation films 122, 126 with the conductor plugs 132 buried in, interconnections 134 are formed.

On the inter-layer insulation film 126, a hydrogen diffusion preventive film 136 is formed, covering the interconnections 134. The hydrogen diffusion preventive film 136 is, e.g., aluminum oxide film.

On the hydrogen diffusion preventive film 136, a silicon oxide film 74 is formed.

On the silicon oxide film 74, a silicon nitride film 76 is formed. The silicon nitride film 76 barriers water to prevent the corrosion of the interconnections 134, etc. with water.

On the silicon nitride film 76, a polyimide resin film 78 is formed.

In the polyimide resin film 78, the silicon nitride film 76, the silicon oxide film 74, the aluminum oxide film 136, openings (not illustrated) are formed down to electrode pads (not illustrated).

Thus, the semiconductor device according to the present embodiment is constituted.

(Evaluation Result)

Next, the result of the evaluation of the semiconductor device according to the present embodiment will be explained.

First, the evaluation was made on the semiconductor device without the aluminum oxide film 120 formed. Of the chips which had been judged normal by the inspection made before the silicon oxide film 122 was formed, chips which were judged normal after the silicon oxide film 122 had been formed were 81.3%. Based on this, it is found that the fabrication yield is relatively low without the aluminum oxide film 120 formed.

Next, the evaluation was made on the semiconductor device according to the present embodiment, i.e., the semiconductor device with the aluminum oxide film 120 formed. Of the chip which had been judged normal by the inspection made before the silicon oxide film 122 was formed, the chips which were judged normal after the silicon oxide film 122 had been formed were 99.6%. Based on this, it is found that the planarized aluminum oxide film 120 formed above the capacitors makes the fabrication yield very high.

Based on the above, it is found that according to the present embodiment, the deterioration of the dielectric film due to hydrogen can be surely prevented, and the semiconductor device can be fabricated with very high fabrication yield.

The semiconductor device according to the present embodiment is characterized mainly in that the planarized hydrogen diffusion preventive film 120 is present above the capacitors 38, as in the semiconductor device according to the first embodiment.

According to the present embodiment, a part of the hydrogen diffusion preventive film 120 present above the capacitors 38 is planarized, whereby the hydrogen diffusion preventive film 120 has very good coverage above the capacitors 38. Accordingly, in the present embodiment as well, the hydrogen diffusion preventive film 120 can surely prevent the arrival of hydrogen at the dielectric film 34 of the capacitors 38. Thus, according to the present embodiment, the reduction of the metal oxide forming the dielectric film 34 of the capacitors 38 can be surely prevented, and the fabrication yield and the reliability can be improved.

(The Method for Fabricating the Semiconductor Device)

Next, the method for fabricating the semiconductor device according to the present embodiment will be explained with reference to FIGS. 20A to 41. FIGS. 20A to 41 are sectional views of the semiconductor device according to the present embodiment in the steps of the method for fabricating the semiconductor device, which illustrate the method.

The steps up to the step of forming the transistors 24 are the same as those of the method for fabricating the semiconductor device according to the first embodiment described above with reference to FIGS. 3A to 4A, and their explanation will be omitted. In the present embodiment, the gate length of the transistors 24 is, e.g., 0.35 μm.

Next, on the entire surface, an SiON film of, e.g., a 200 nm-thickness and a silicon oxide film of, e.g., a 600 nm-thickness are sequentially laid one on the other. The SiON film and the silicon oxide film form the inter-layer insulation film 26.

Then, the surface of the inter-layer insulation film 26 is polished by, e.g., CMP. Thus, the surface of the inter-layer insulation film 26 is planarized (see FIG. 20A).

Next, thermal processing is made in an $N_2$ atmosphere. The thermal processing temperature is, e.g., 650° C. The thermal processing period of time is, e.g., 30 minutes.

Figure 20A:
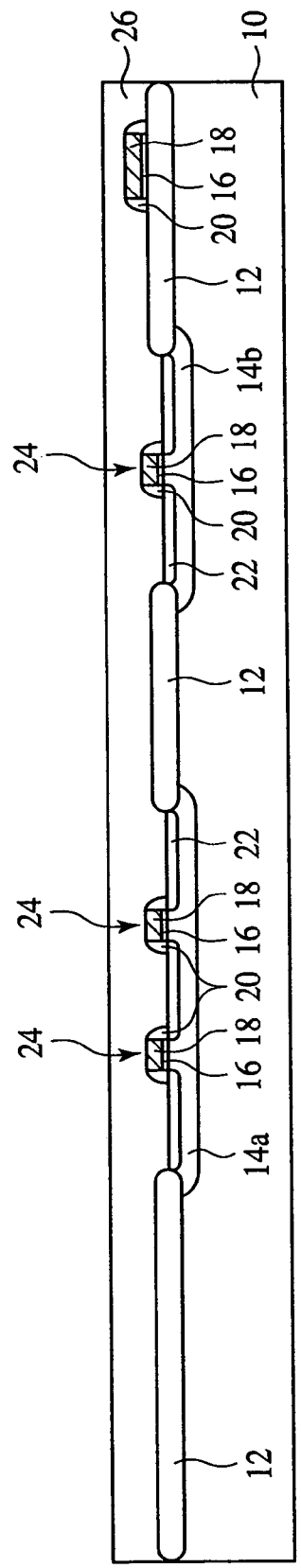
FIGS. 20A and 20B are sectional views of the semiconductor device according to the second embodiment in the steps of the method for fabricating the semiconductor device, which illustrate the method (Part 1).
Figure 20B:
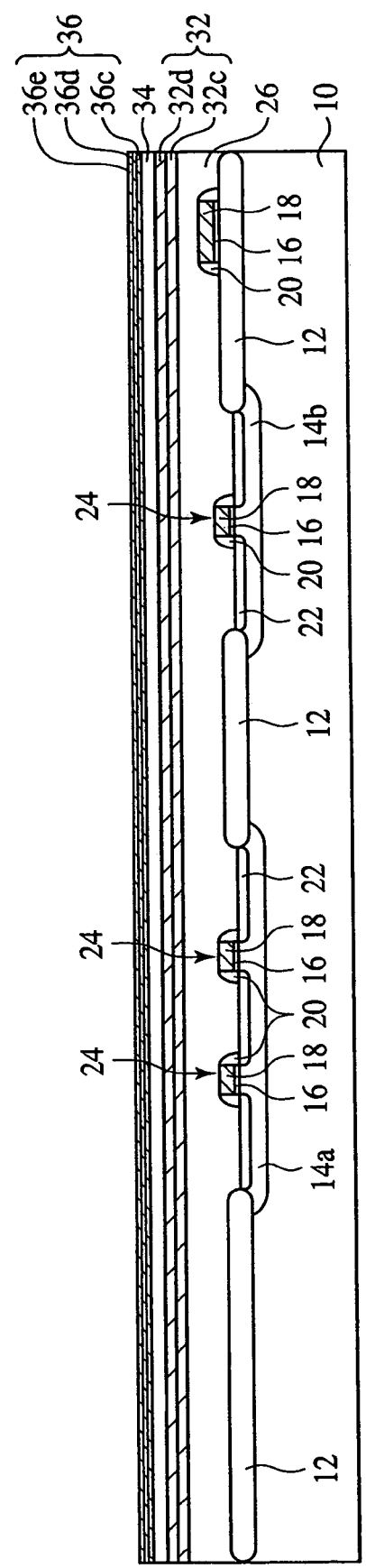

Next, as illustrated in FIG. 20B, an 20 to 100 nm-thickness aluminum oxide film 32c is formed on the entire surface by, e.g., sputtering or CVD.

Next, a 100 to 300 nm-thickness Pt film 32d is formed on the entire surface by, e.g., sputtering. The film thickness of the Pt film 32d is 175 nm.

Next, the dielectric film 34 is formed on the entire surface by, e.g., sputtering. As the dielectric film, a ferroelectric film, for example, is formed. More specifically, a PZT film of, e.g., a 150 nm-thickness is formed.

Next, thermal processing is made in an oxygen atmosphere by RTA. The thermal processing temperature is, e.g., 650-800° C. The thermal processing period of time is, e.g., 30 to 120 seconds. The thermal processing temperature is 750° C., and the thermal processing period of time is 60 seconds.

Next, a 10 to 100 nm-thickness $IrO_X$ film 36c is formed by, e.g., sputtering or MOCVD.

Then, a 100 to 300 nm-thickness $IrO_Y$ film 36d is formed by, e.g., sputtering or MOCVD. At this time, the $IrO_Y$ film 36d is formed so that the composition ratio Y of the oxygen of the $IrO_Y$ 36d is larger than the composition ratio X of the oxygen of the $IrO_X$ film 36c.

Next, a 20 to 100 nm-thickness Pt film 36e is formed by, e.g., sputtering or MOCVD. The film thickness of the Pt film 36e is 75 nm. The film forming temperature of the Pt film 36e is, e.g., 450° C. Thus, a layer film 36 is formed of the $IrO_X$ film 36c, the $IrO_Y$ film 36d and Pt film 36e. The layer film 36 is to be the upper electrodes of the capacitors 38.

The Pt film 36e is for preventing the reduction of the surfaces of the upper electrodes 36 and decreasing the contact resistance between the interconnection 102 and the upper electrodes 36. Unless it is necessary to reduce the contact resistance between the interconnections 102 and the upper electrodes 36, the Pt film 36e may not be formed.

Next, a photoresist film 80 is formed on the entire surface by, e.g., spin coating.

Next, the photoresist film 80 is patterned into the plane shape of the upper electrodes 36 by photolithography.

Then, with the photoresist film 80 as the mask, the layer film 36 of the $IrO_X$ film 36c, the $IrO_Y$ film 36d and the Pt film 36e is etched (see FIG. 21A). The etching gases are Ar gas and $Cl_2$ gas. Thus, the upper electrodes 36 of the layer film are formed. Then, the photoresist film is released.

Next, thermal processing is made by RTA in an oxygen atmosphere and, for example, at 650° C. or above for 1 to 3 minutes. This thermal processing is for preventing the occurrence of abnormalities in the surfaces of the upper electrodes 36.

Next, thermal processing is made in an oxygen atmosphere and, for example at 650° C. for 60 minutes. This thermal processing is for improving the film quality of the dielectric film 34.

Next, a photoresist film 82 is formed on the entire surface by, e.g., spin coating.

Next, the photoresist film 82 is patterned into the plane shape of the dielectric film 34 by photolithography.

Next, with the photoresist film 82 as the mask, the dielectric film 34 is etched (see FIG. 21B). Then, the photoresist film 82 is released.

Next, thermal processing is made in an oxygen atmosphere and, e.g., for 350° C. for 60 minutes. This thermal processing is for improving the adhesion of the hydrogen diffusion preventive film 40 to be formed in a later step to the base.

Figure 22A:
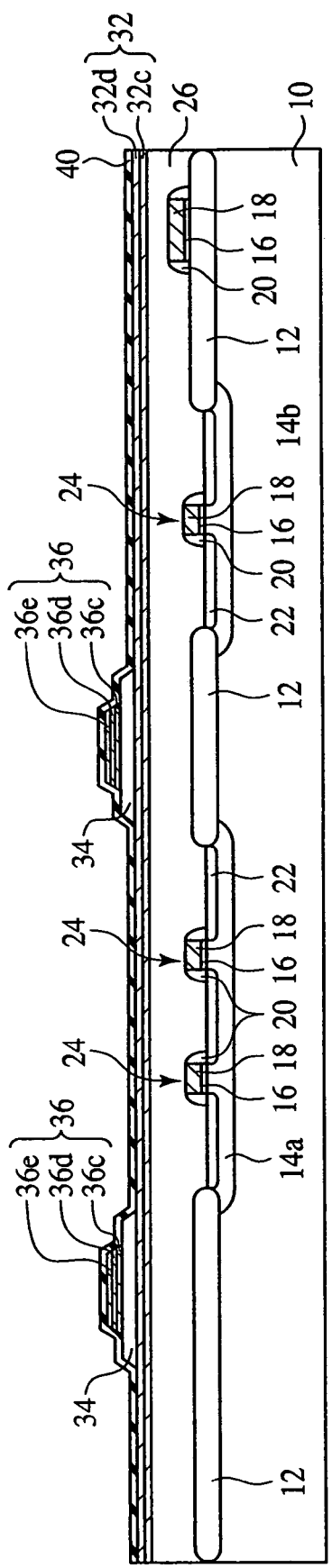
FIGS. 22A and 22B are sectional views of the semiconductor device according to the second embodiment in the steps of the method for fabricating the semiconductor device, which illustrate the method (Part 3).

Next, as illustrated in FIG. 22A, the hydrogen diffusion preventive film 40 is formed by, e.g., sputtering or CVD. As the hydrogen diffusion preventive film 40, an aluminum oxide film of, e.g., a 20 to 150 nm-thickness is formed.

Then, a photoresist film 84 is formed on the entire surface by, e.g., spin coating.

Next, the photoresist film 84 is patterned into the plane shape of the lower electrodes 32 by photolithography.

Figure 22B:
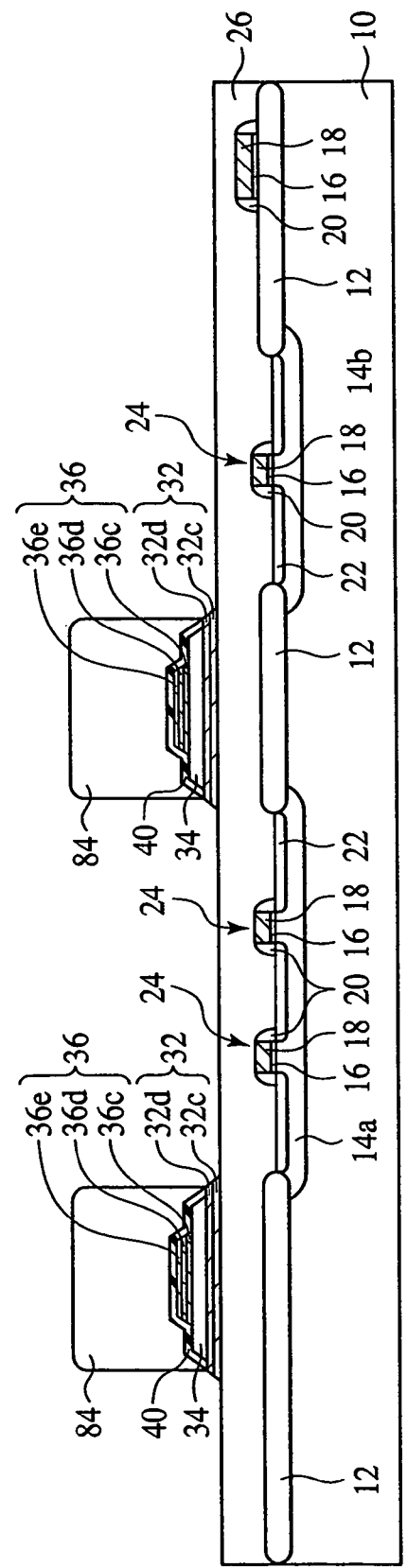

Next, with the photoresist film 84 as the mask, the hydrogen diffusion preventive film 40, the Pt film 32d and the aluminum oxide film 32c are patterned (see FIG. 22B). Thus, the lower electrodes 32 of the aluminum oxide film 32c and the Pt film are formed. The hydrogen diffusion preventive film 40 is left, covering the upper electrodes 36 and the dielectric film 34. Then, the photoresist film 84 is released.

Then, thermal processing is made in an $O_2$ atmosphere. The thermal processing temperature is, e.g., 350° C., and the thermal processing period of time is, e.g., 30 to 60 minutes.

Figure 23A:
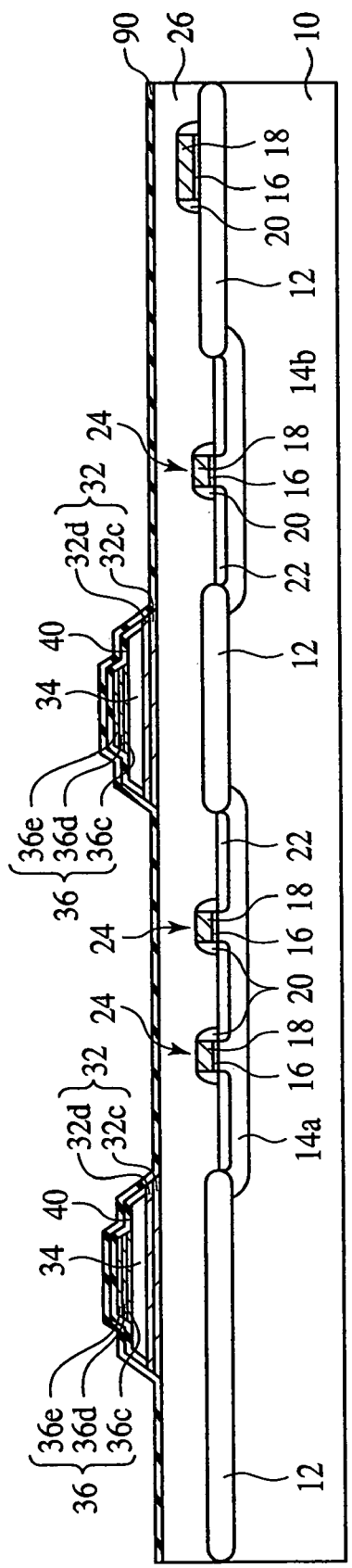
FIGS. 23A and 23B are sectional views of the semiconductor device according to the second embodiment in the steps of the method for fabricating the semiconductor device, which illustrate the method (Part 4).

Then, as illustrated in FIG. 23A, the hydrogen diffusion preventive film 90 is formed by, e.g., sputtering or CVD. As the hydrogen diffusion preventive film 90, an aluminum oxide film of, e.g., a 20 to 50 nm-thickness is formed.

Figure 23B:
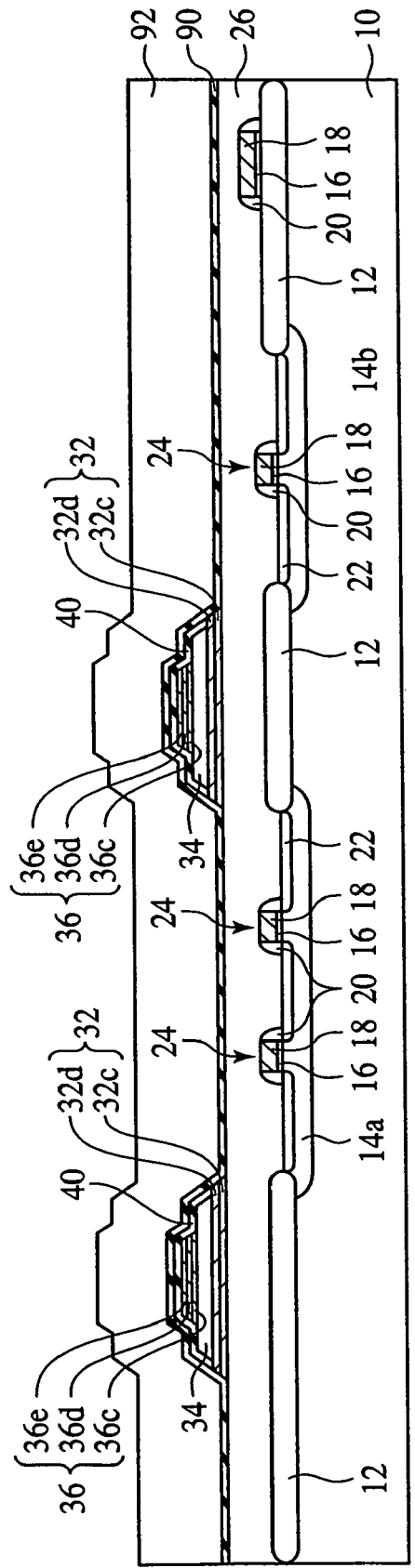

Then, as illustrated in FIG. 23B, a 1500 nm-thickness silicon oxide film 92 is formed by, e.g., plasma TEOS CVD. The raw material gases is a mixed gas of, e.g., TEOS gas, oxygen gas and helium gas.

Then, as illustrated in FIG. 24A, the surface of the silicon oxide film 92 is planarized by CMP. Thus, the inter-layer insulation film 92 of the silicon oxide film is formed.

Next, thermal processing is made in a plasma atmosphere generated by using $N_2O$ gas. This thermal processing is for removing water contained in the silicon oxide film 92 and also improving the film quality of the silicon oxide film 92. The substrate temperature for the thermal processing is, e.g., 350° C. The flow rate of the $N_2O$ gas is, e.g., 1000 sccm. The flow rate of the $N_2$ gas is, e.g., 285 sccm. The opposed electrode gap is, e.g., 300 mils. The applied high-frequency power is, e.g., 525 W. The gas pressure inside the chamber is, e.g., 3 Torr.

Next, as illustrated in FIG. 24B, by photolithography, the contact holes 94 are formed in the inter-layer insulation film 92, the hydrogen diffusion preventive film 90 and the inter-layer insulation film 26 down to the source/drain diffused layer 22.

Next, plasma cleaning using argon is made. This cleaning removes natural oxide film, etc. present on the surface of the source/drain diffused layer 22. The conditions for the plasma cleaning are so set that, for example, the thermal oxide film is removed by 20 nm.

Next, a 20 nm-thickness Ti film is formed on the entire surface by, e.g., sputtering.

Next, a 50 nm-thickness TiN film is formed on the entire surface by, e.g., sputtering. The Ti film and the TiN film form the barrier metal film 96 (see FIG. 25A). Preferably, the Ti film and the TiN film are formed uninterruptedly without being exposed to the atmosphere.

Figure 25A:
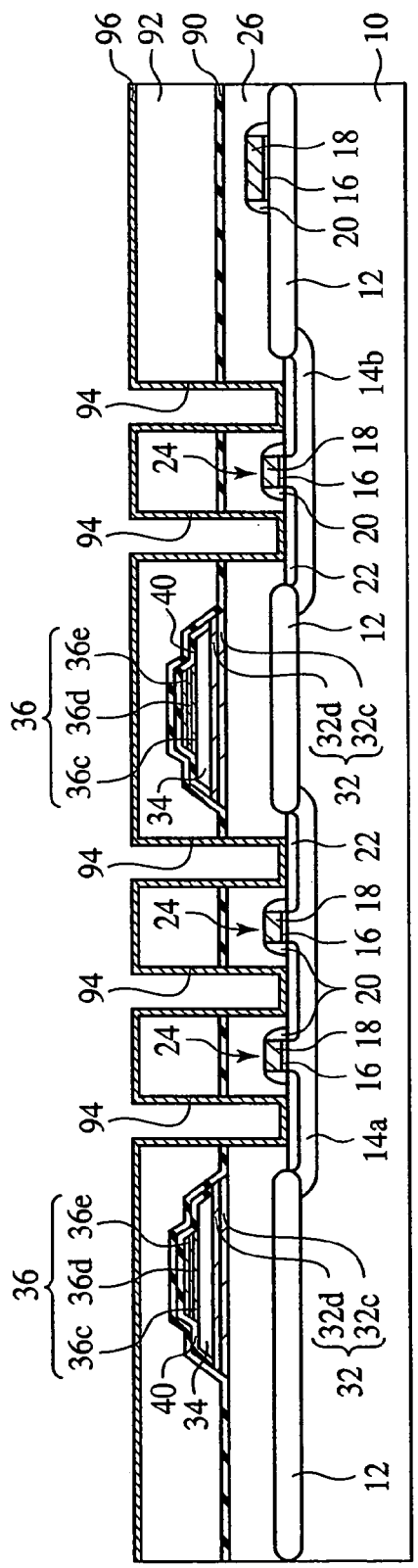
FIGS. 25A and 25B are sectional views of the semiconductor device according to the second embodiment in the steps of the method for fabricating the semiconductor device, which illustrate the method (Part 6).
Figure 25B:
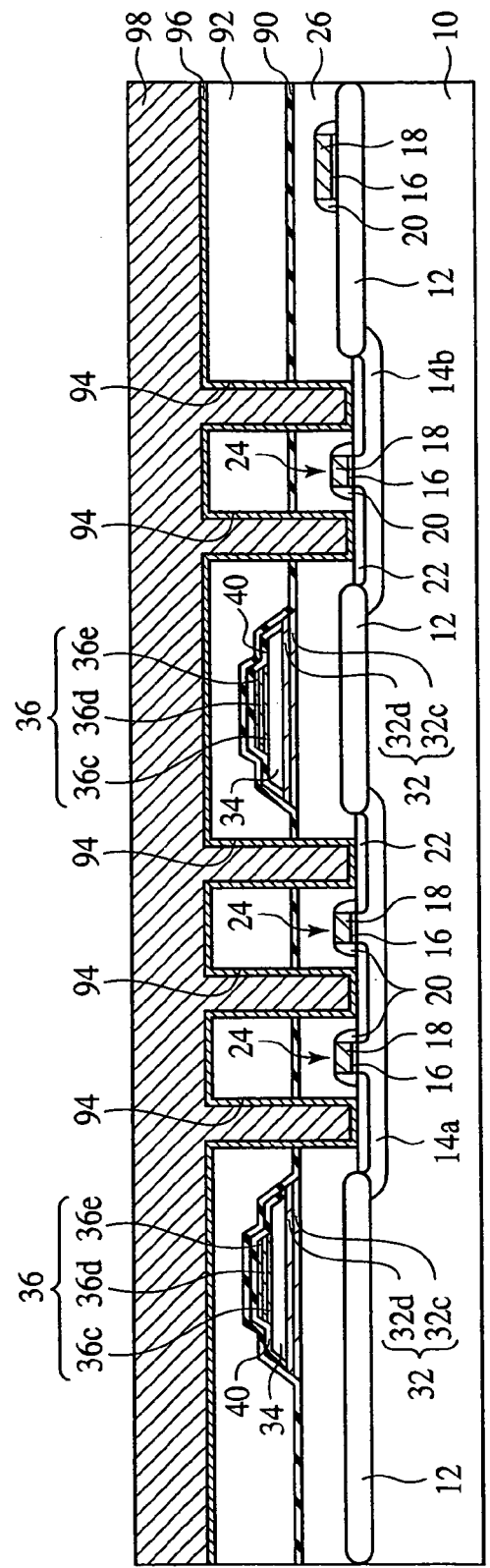

As illustrated in FIG. 25B, a 500 nm-thickness tungsten film 98 is formed on the entire surface by, e.g., CVD.

Next, as illustrated in FIG. 26A, the tungsten film 98 and the barrier metal film 96 are polished by, e.g., CMP until the surface of the inter-layer insulation film 92 is exposed. Thus, the conductor plugs 98 of tungsten are buried in the contact holes 94.

Next, as illustrated in FIG. 26B, a 100 nm-thickness SiON film 138 is formed on the entire surface by, e.g., CVD. The SiON film 138 is for preventing the oxidation of the surfaces of the conductor plugs 98.

Next, as illustrated in FIG. 27A, by photolithography, the contact holes 100 and the contact holes (not illustrated) are formed in the SiON film 138, the inter-layer insulation film 92, the hydrogen diffusion preventive films 90, 40 respectively down to the upper electrodes 36 of the capacitors 38 and down to the lower electrodes 32 of the capacitors 38.

Then, thermal processing is made in an oxygen atmosphere. The thermal processing temperature is, e.g., 550° C. The thermal processing period of time is, e.g., 60 minutes.

Next, as illustrated in FIG. 27B, the entire surface is etched back to remove the SiON film 138. Thus, the surfaces of the conductor plugs 98 are exposed.

Next, plasma cleaning using argon gas is made. This plasma cleaning removes natural oxide film, etc. present on the surfaces of the conductor plugs 98. The conditions for the plasma cleaning are so set that, for example, the thermal oxide film is removed by 10 nm.

Next, a 150 nm-thickness TiN film, a 550 nm-thickness AlCu alloy film, a 10 nm-thickness Ti film and a 150 nm-thickness TiN film are sequentially formed by, e.g., sputtering. Thus, the layer film 102 of the TiN film, the AlCu alloy film, the Ti film and the TiN film is formed.

Next, the layer film 102 is patterned by photolithography. The interconnections 102 are formed of the layer film (see FIG. 28A).

Next, thermal processing is made in a nitrogen atmosphere. The thermal processing temperature is, e.g., 350° C. The thermal processing period of time is, e.g., 30 minutes.

Figure 28A:
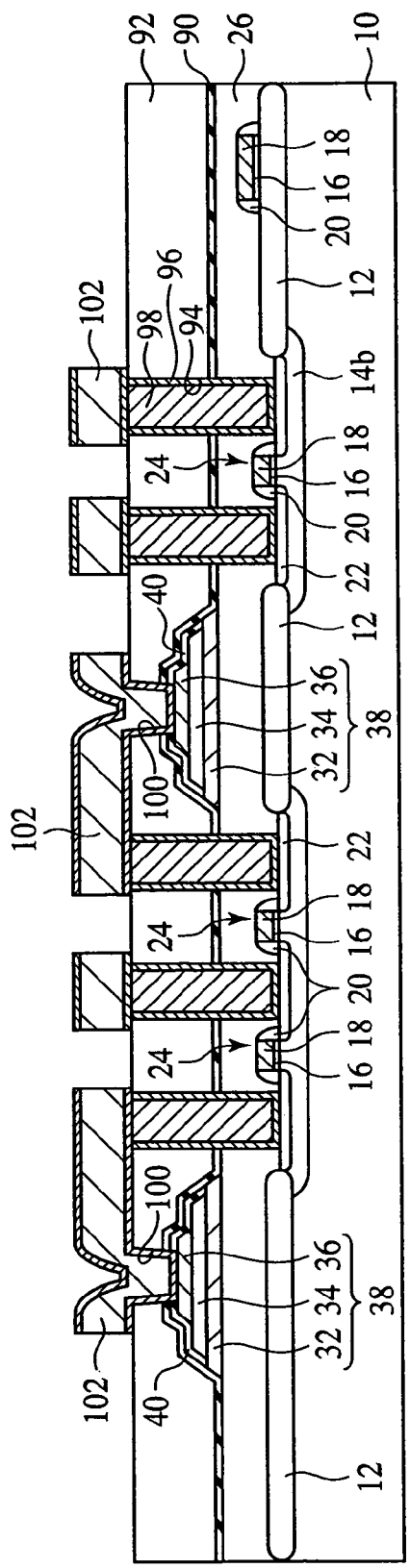
FIGS. 28A and 28B are sectional views of the semiconductor device according to the second embodiment in the steps of the method for fabricating the semiconductor device, which illustrate the method (Part 9).
Figure 28B:
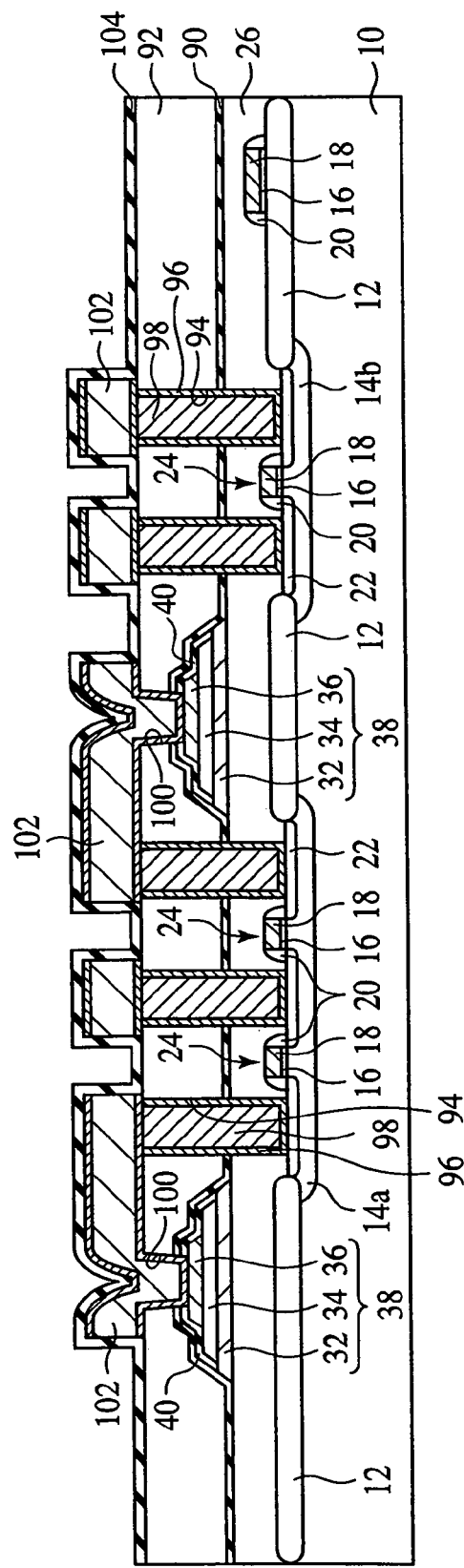

Then, as illustrated in FIG. 28B, the hydrogen diffusion preventive film 104 is formed on the entire surface by, e.g., sputtering or CVD. As the hydrogen diffusion preventive film 104, an aluminum oxide film of, e.g., a 20 to 100 nm-thickness is formed.

Figure 29:
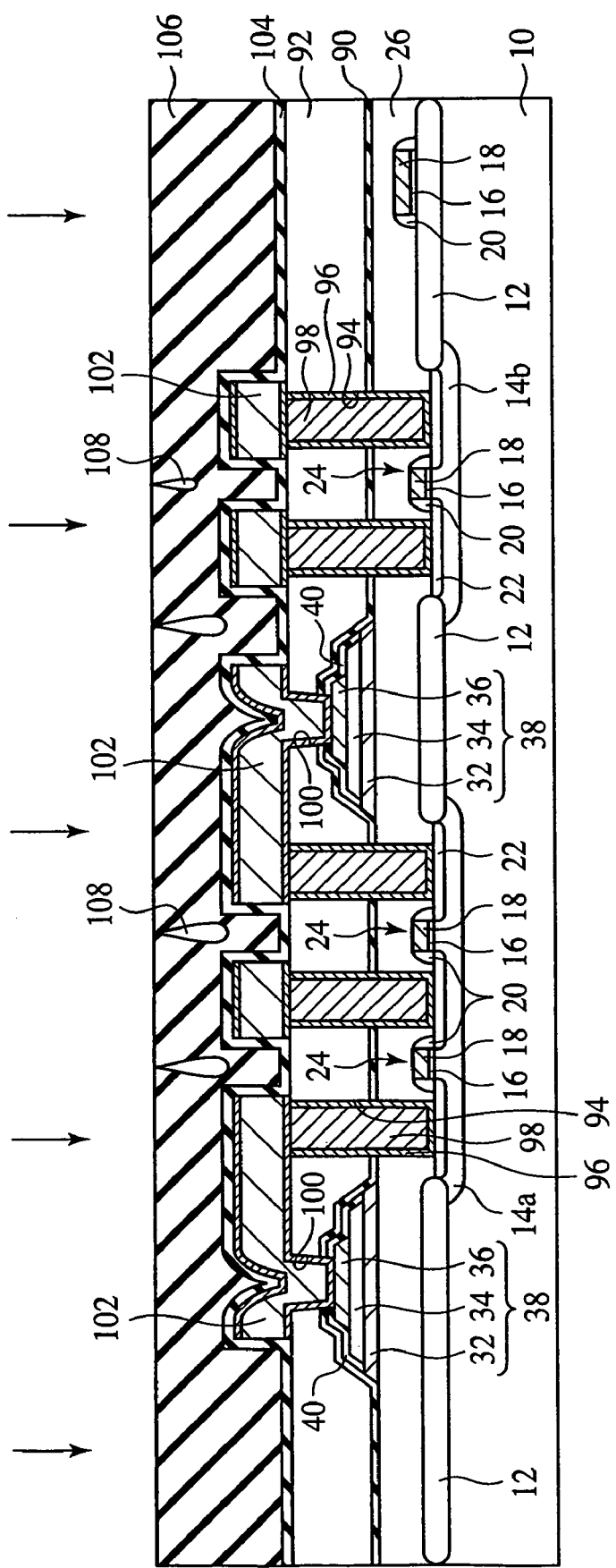
FIG. 29 is a sectional view of the semiconductor device according to the second embodiment in the steps of the method for fabricating the semiconductor device, which illustrates the method (Part 10).

Then, as illustrated in FIG. 29, a silicon oxide film 106 of, e.g., a 2.0 to 2.5 µm-thickness is formed by plasma TEOS CVD.

Next, the surface of the silicon oxide film 106 is planarized by, e.g., CMP. Thus, the planarized silicon oxide film 106 is formed. Voids 108 are formed in the upper part of the silicon oxide film 106 above the region where the gap between the interconnections 102 is small.

Next, thermal processing is made in a plasma atmosphere generated by using $N_2O$ gas. This thermal processing is for removing water in the silicon oxide film 106 and also for improving the film quality of the silicon oxide film 106. The substrate temperature for the thermal processing is, e.g., 350° C. The flow rate of the $N_2O$ gas is, e.g., 1000 sccm. The flow rate of the $N_2$ gas is, e.g., 285 sccm. The gap between the opposed electrodes is, e.g., 300 mils. The applied high-frequency power is, e.g., 525 W. The gas pressure inside the chamber is, e.g., 3 Torr.

Figure 30:
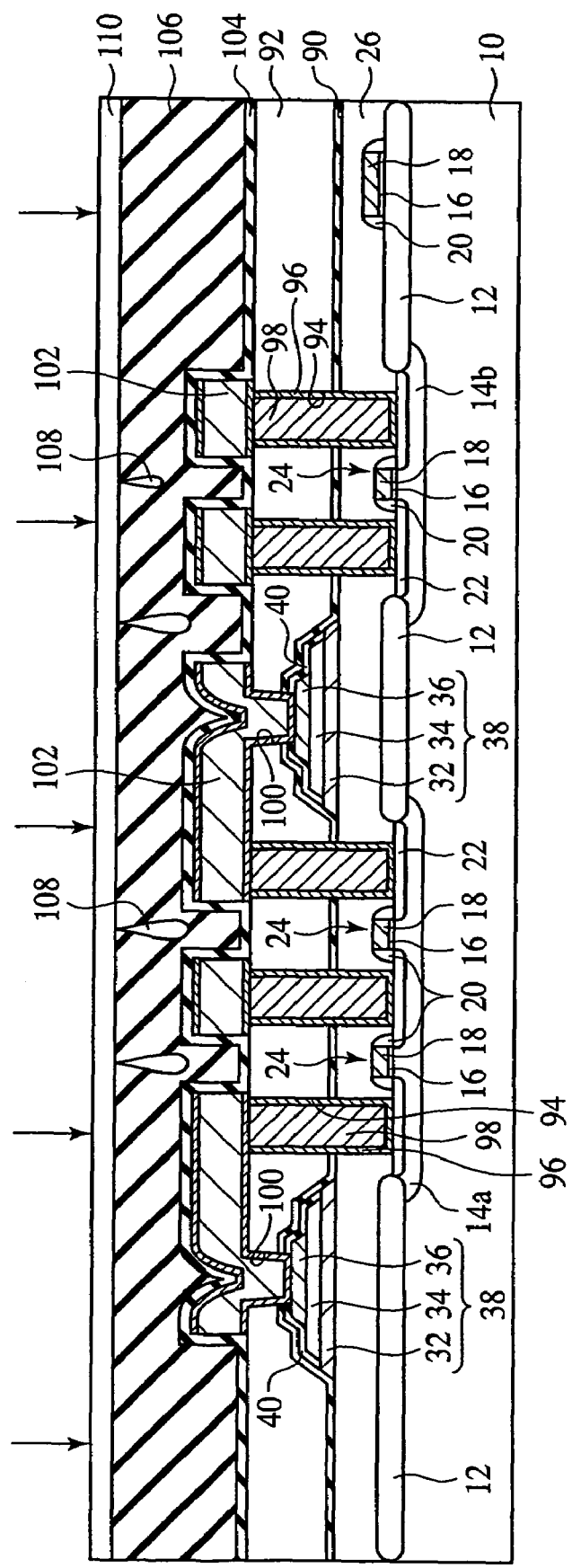
FIG. 30 is a sectional view of the semiconductor device according to the second embodiment in the steps of the method for fabricating the semiconductor device, which illustrates the method (Part 11).

Next, as illustrated in FIG. 30, a 100 to 300 nm-thickness silicon oxide film 110 is formed on the entire surface by plasma TEOS CVD. The silicon oxide film 110 is formed for covering voids 108 present in the upper part of the silicon oxide film 106. Since the silicon oxide film 110 is formed on the silicon oxide film 106 having the surface planarized, the silicon oxide film 110 is planarized.

Then, thermal processing is made in a plasma atmosphere generated by using $N_2O$ gas. This thermal processing is for removing water in the silicon oxide film 110 and also for improving the film quality of the silicon oxide film 110. The substrate temperature for the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

Next, the contact holes 112 are formed in the inter-layer insulation films 110, 106 down to the interconnections 102 by photolithography.

Then, plasma cleaning using argon gas is made. This plasma cleaning removes natural oxide film, etc. present on the surfaces of the interconnections. The conditions for the plasma cleaning are so set that, for example the thermal oxide film is removed by 20 nm.

Figure 31:
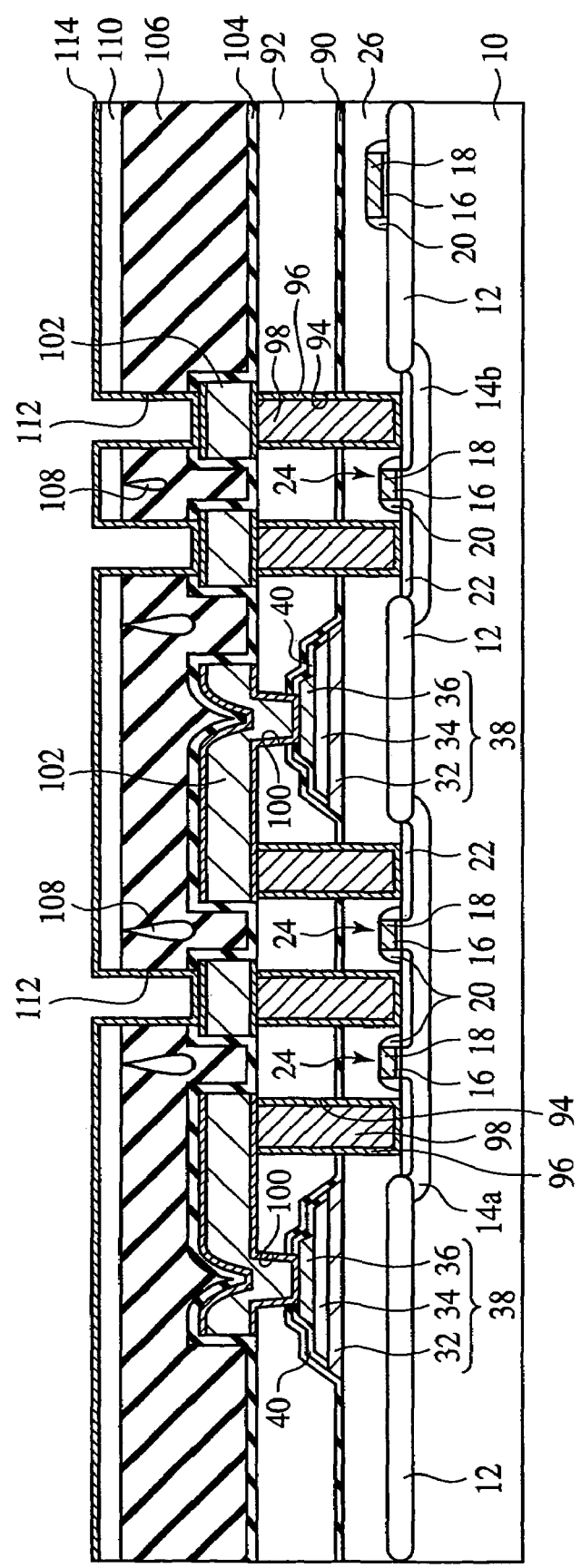
FIG. 31 is a sectional view of the semiconductor device according to the second embodiment in the steps of the method for fabricating the semiconductor device, which illustrates the method (Part 12).

Then, as illustrated in FIG. 31, a 50 nm-thickness TiN film 114 is formed by, e.g., sputtering.

Figure 32:
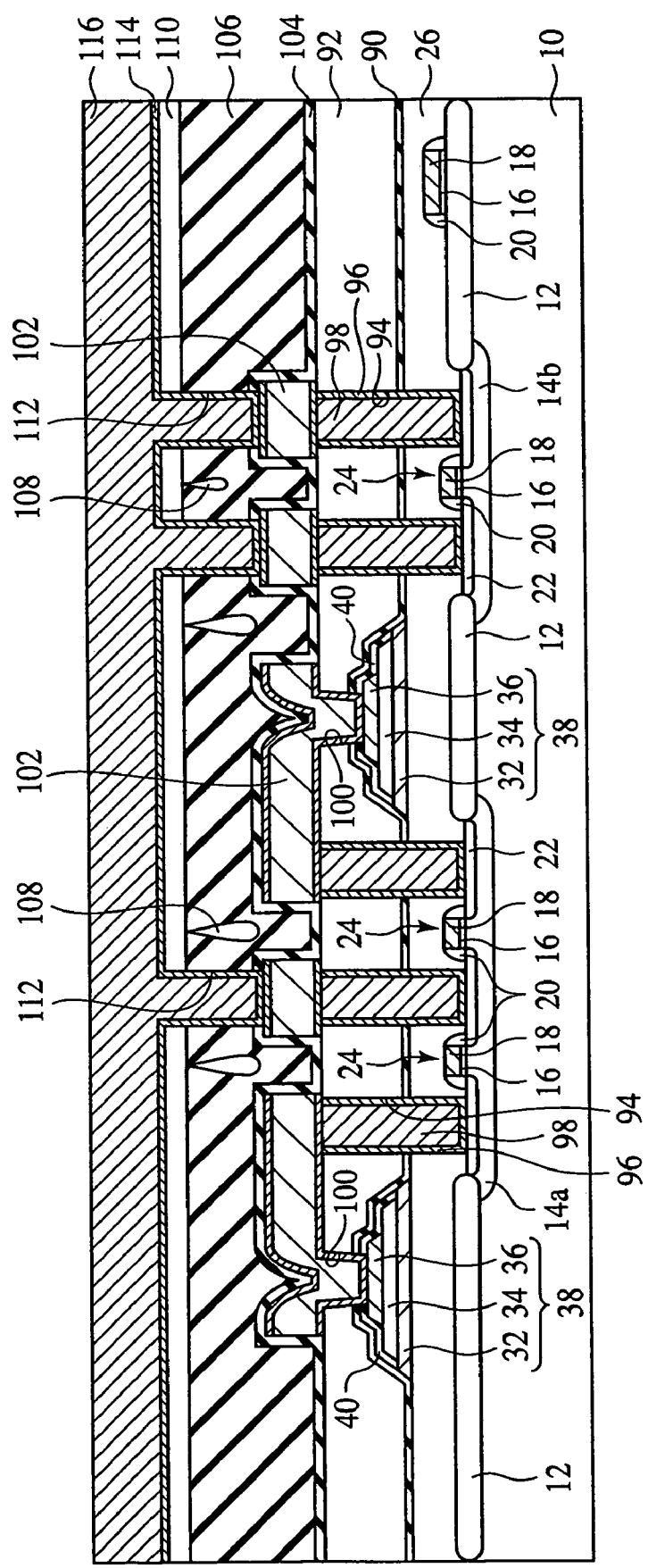
FIG. 32 is a sectional view of the semiconductor device according to the second embodiment in the steps of the method for fabricating the semiconductor device, which illustrates the method (Part 13).

Next, as illustrated in FIG. 32, a 600 to 800 nm-thickness tungsten film 116 is formed by, e.g., CVD.

Figure 33:
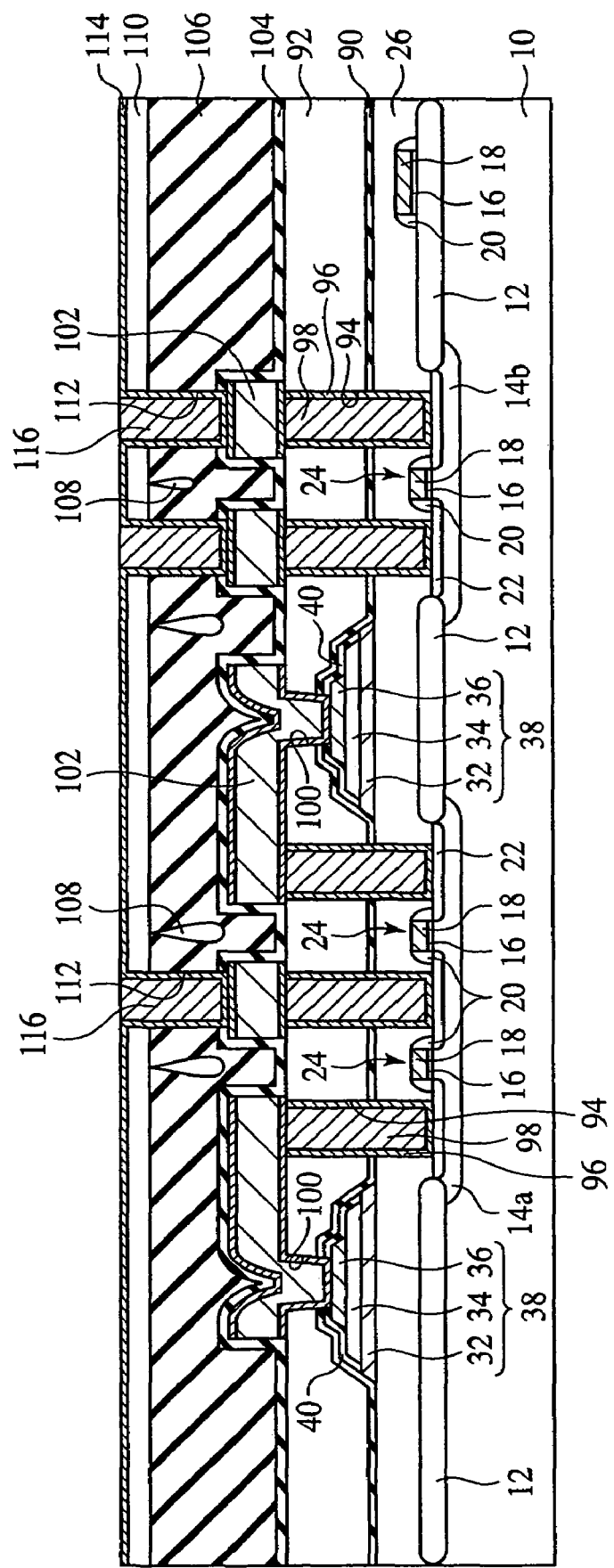
FIG. 33 is a sectional view of the semiconductor device according to the second embodiment in the steps of the method for fabricating the semiconductor device, which illustrates the method (Part 14).

Then, as illustrated in FIG. 33, the entire surface is etched back to remove the tungsten film 116 except that inside the contact holes 112. Thus, the conductor plugs 116 of the tungsten are buried in the contact holes 112.

Figure 34:
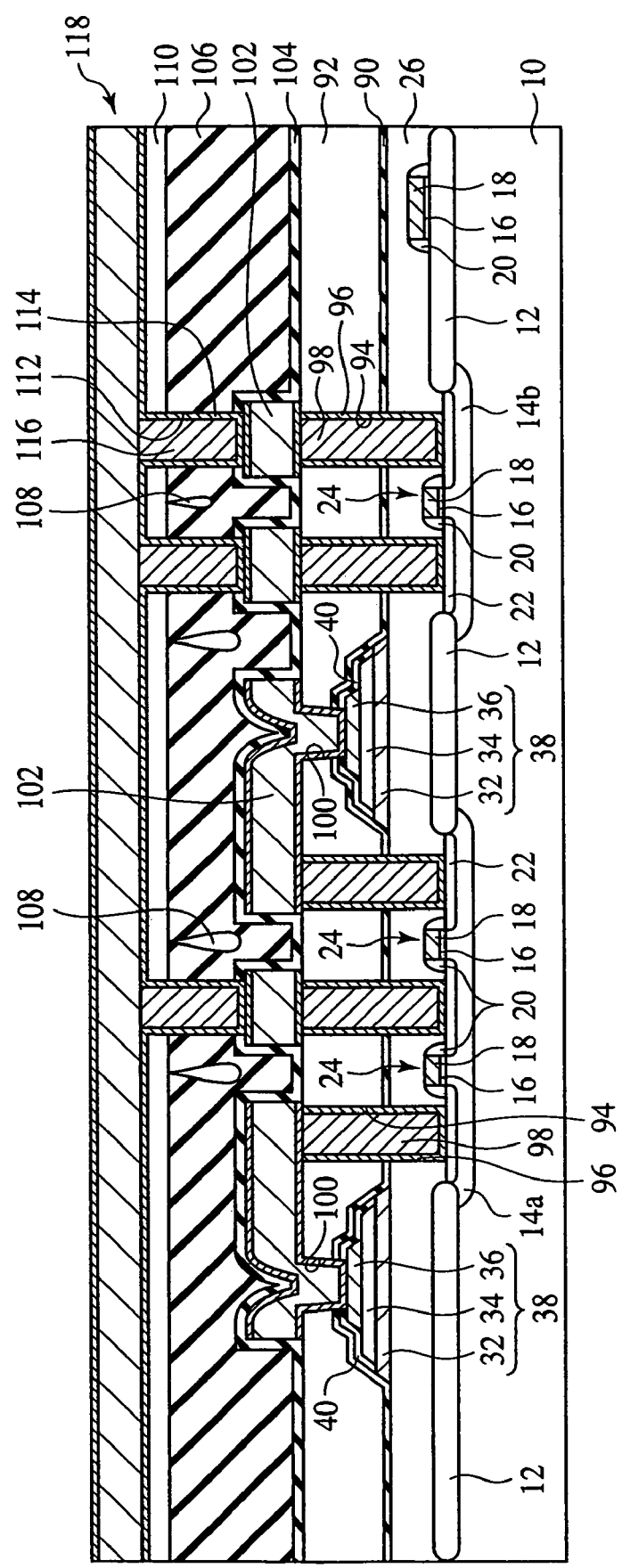
FIG. 34 is a sectional view of the semiconductor device according to the second embodiment in the steps of the method for fabricating the semiconductor device, which illustrates the method (Part 15).

Then, as illustrated in FIG. 34, a 500 nm-thickness AlCu alloy film, a 10 nm-thickness Ti film and a 150 nm-thickness TiN film are formed on the entire surface by, e.g., sputtering. The TiN film 114, the AlCu alloy film, the Ti film and the TiN film form the layer film 118.

Figure 35:
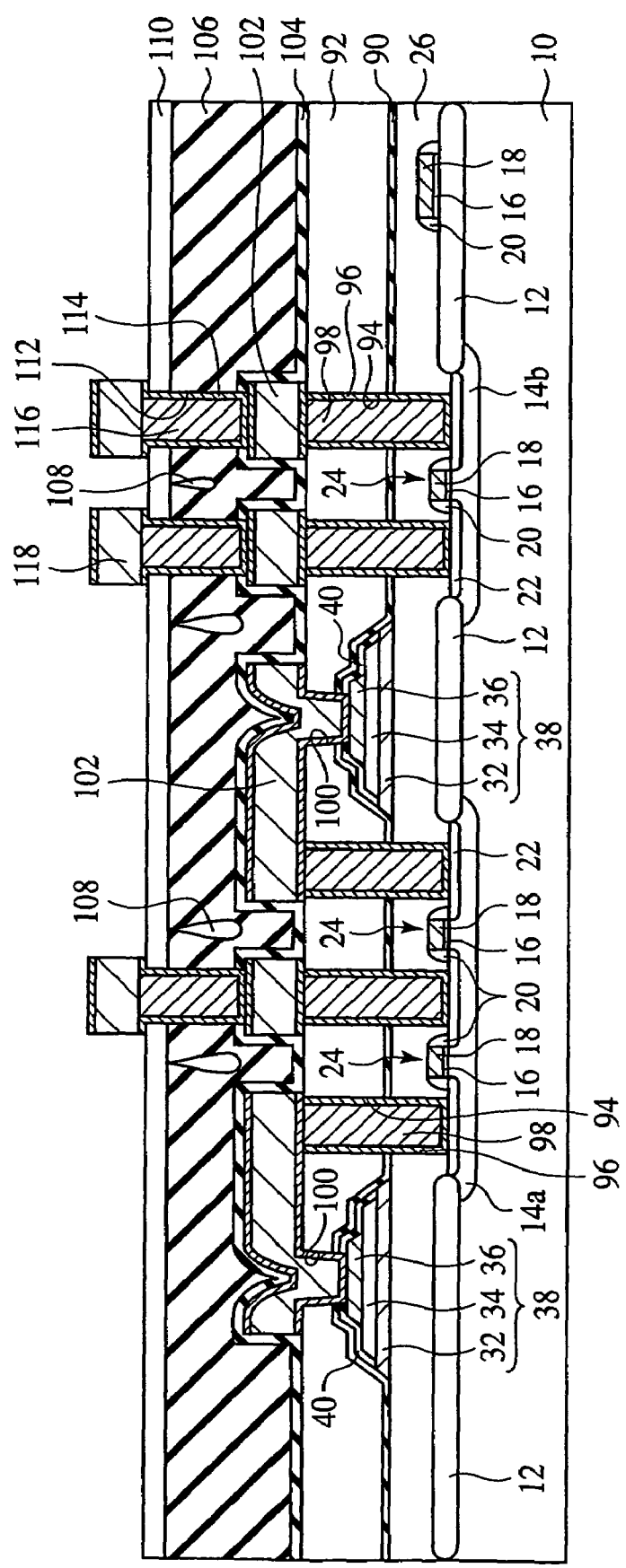
FIG. 35 is a sectional view of the semiconductor device according to the second embodiment in the steps of the method for fabricating the semiconductor device, which illustrates the method (Part 16).

Then, as illustrated in FIG. 35, the layer film 118 is patterned by photolithography. Thus, the interconnections 118 of the layer film are formed.

Then, thermal processing is made in an $N_2$ atmosphere. The thermal processing temperature is, e.g., 350° C., and thermal processing period of time is, e.g., 30 minutes.

Figure 36:
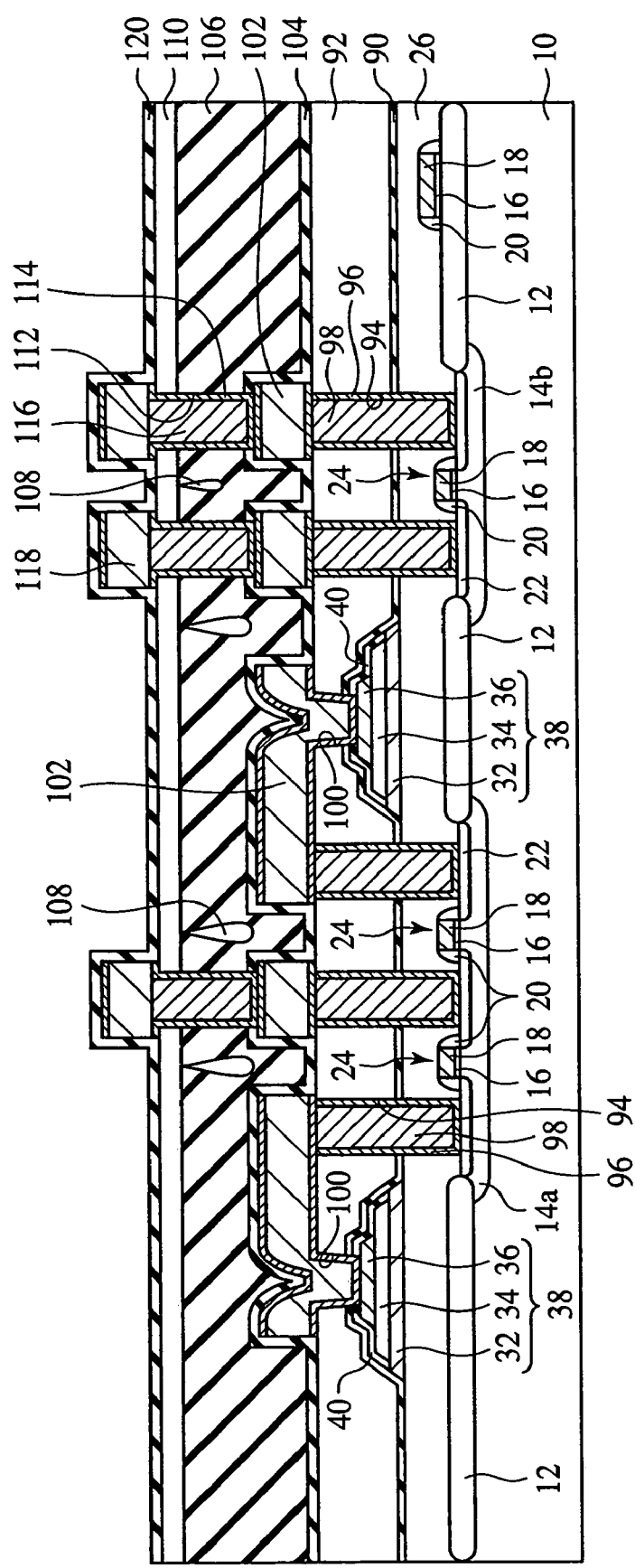
FIG. 36 is a sectional view of the semiconductor device according to the second embodiment in the steps of the method for fabricating the semiconductor device, which illustrates the method (Part 17).

Next, as illustrated in FIG. 36, the hydrogen diffusion preventive film 120 is formed on the entire surface by, e.g., sputtering or CVD. As the hydrogen diffusion preventive film 120, an aluminum oxide film of, e.g., a 20 to 100 nm-thickness is formed.

Figure 37:
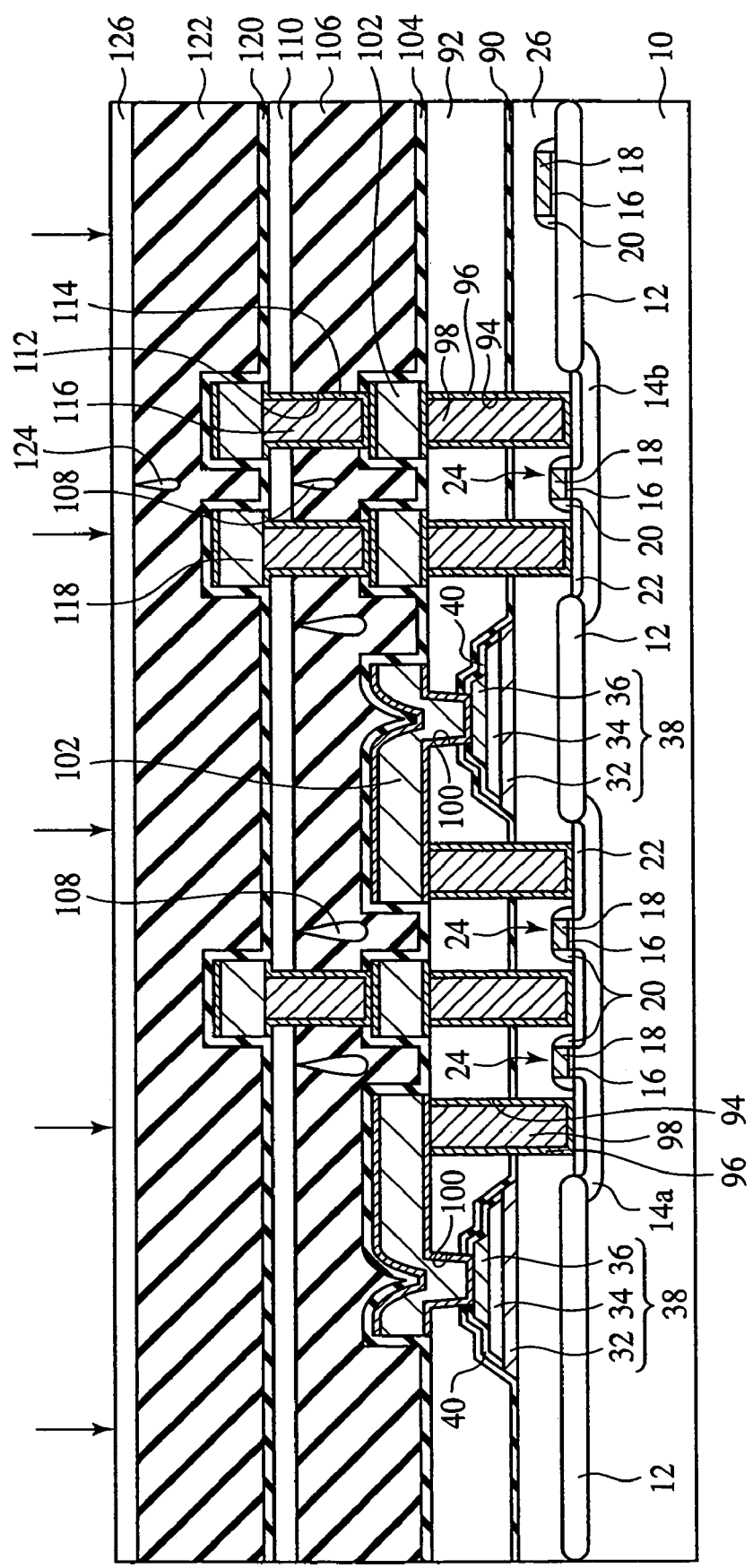
FIG. 37 is a sectional view of the semiconductor device according to the second embodiment in the steps of the method for fabricating the semiconductor device, which illustrates the method (Part 18).

Next, as illustrated in FIG. 37, a silicon oxide film 122 of, e.g., a 2.0 to 2.5 μm-thickness is formed by plasma TEOS CVD.

Next, the surface of the silicon oxide film 122 is planarized by, e.g., CMP. Voids 124 are generated in the upper part of the silicon oxide film 122 above the regions where the gap of the interconnections 118 is small.

Then, thermal processing is made in a plasma atmosphere generated by using $N_2O$ gas. This thermal processing is for removing water in the silicon oxide film 122 and also for improving the film quality of the silicon oxide film 122. The substrate temperature for the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

Then, a 100 to 300 nm-thickness silicon oxide film 126 is formed on the entire surface by plasma TEOS CVD. The silicon oxide film 126 is for covering voids 124 present in the upper part of the silicon oxide film 122. Since the silicon oxide film 126 is formed on the silicon oxide film 122 having the surface planarized, the silicon oxide film 126 is planarized.

Next, thermal processing is made in a plasma atmosphere generated by using $N_2O$ gas. This thermal processing is for removing water in the silicon oxide film 126 and also for improving the film quality of the silicon oxide film 126. The substrate temperature for the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

The processing of the steps of forming the silicon oxide films 122, 126 tends to damage the capacitors 38 by hydrogen, but because of the planarized hydrogen diffusion preventive film 120 above the capacitors 38, the arrival of hydrogen at the dielectric film 34 of the capacitors 38 can be surely prevented.

Figure 38:
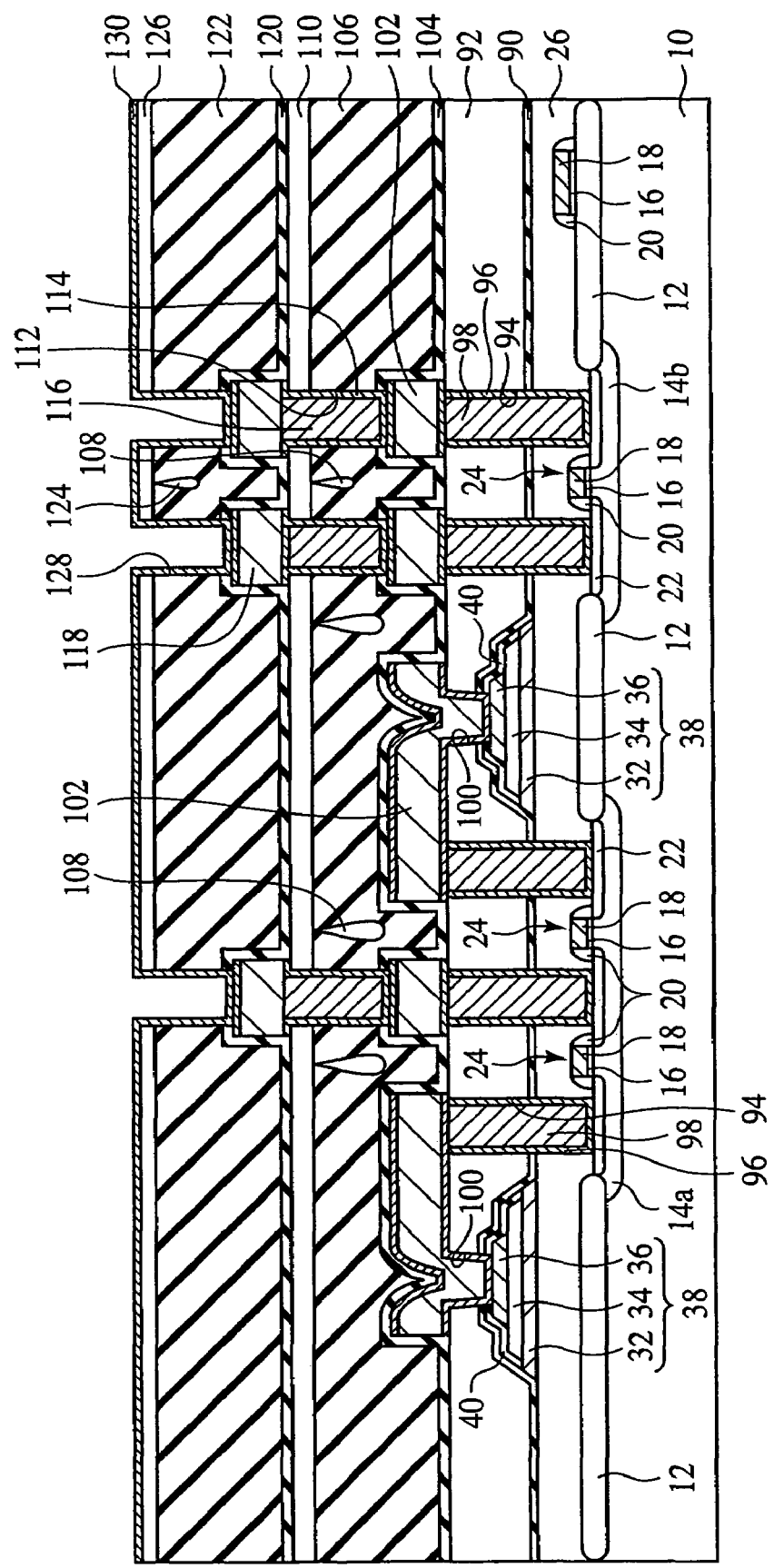
FIG. 38 is a sectional view of the semiconductor device according to the second embodiment in the steps of the method for fabricating the semiconductor device, which illustrates the method (Part 19).
Figure 39:
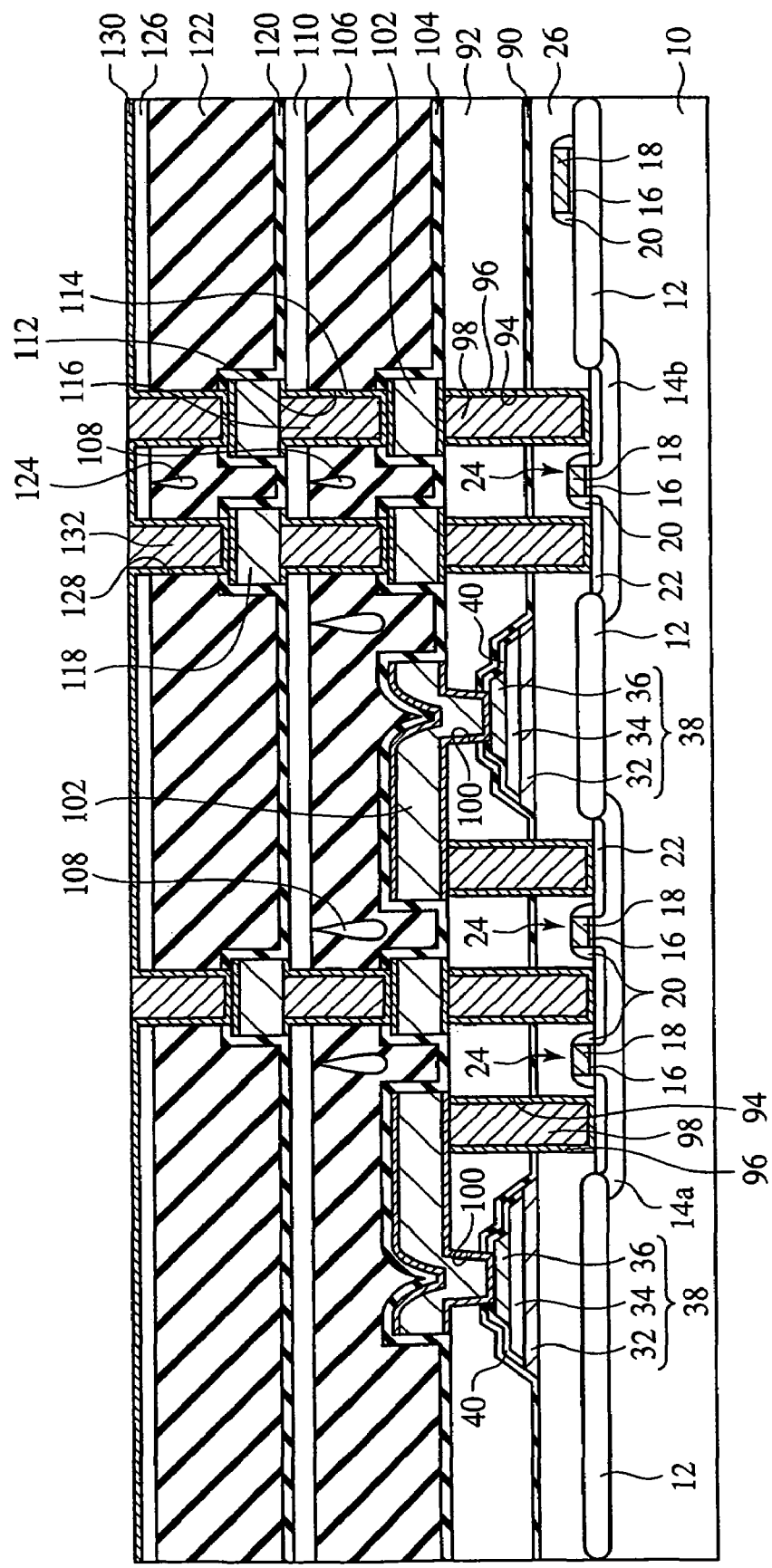
FIG. 39 is a sectional view of the semiconductor device according to the second embodiment in the steps of the method for fabricating the semiconductor device, which illustrates the method (Part 20).
Figure 40:
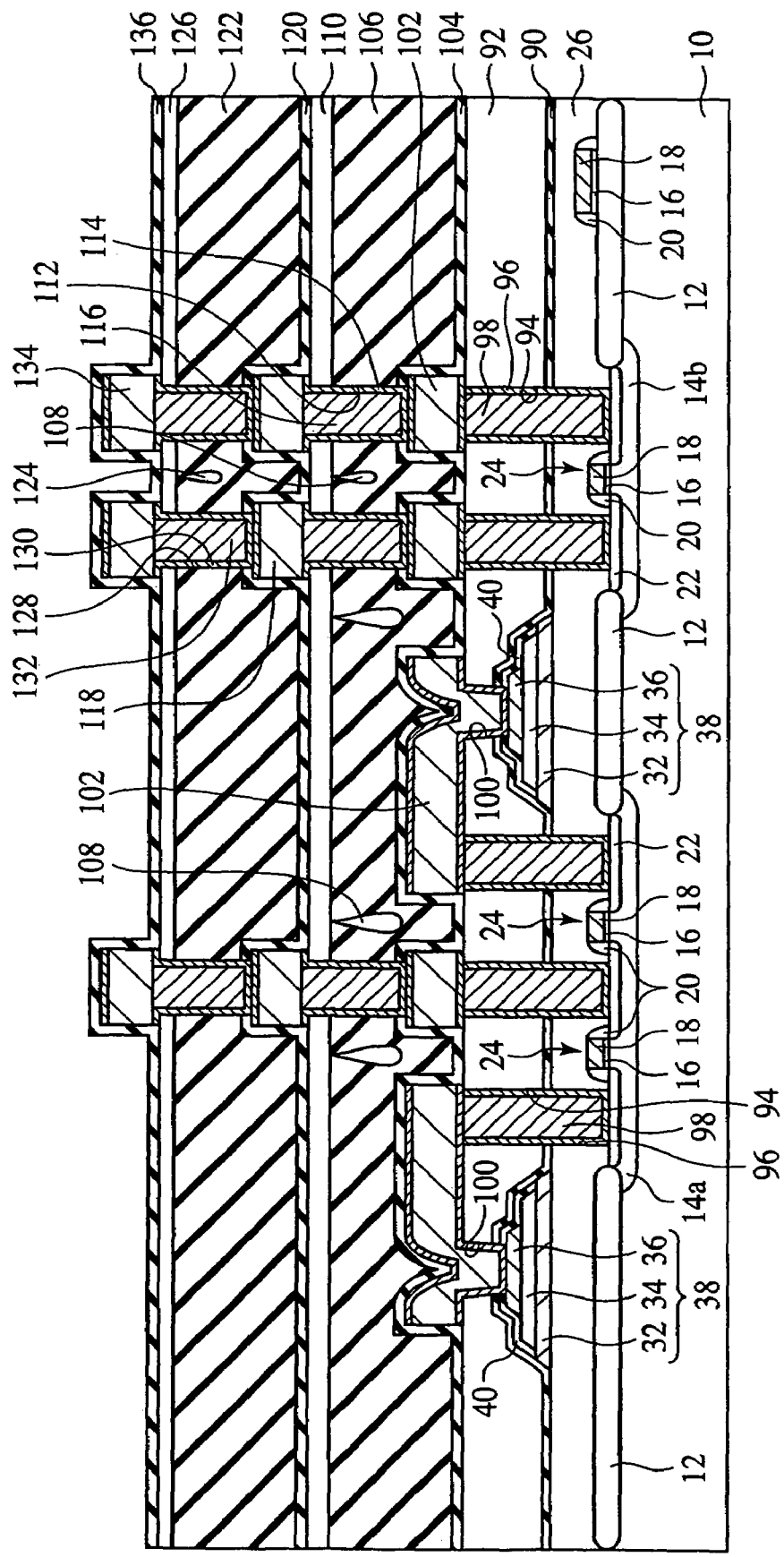
FIG. 40 is a sectional view of the semiconductor device according to the second embodiment in the steps of the method for fabricating the semiconductor device, which illustrates the method (Part 21).

Next, as illustrated in FIG. 38, the contact holes 128 are formed in the inter-layer insulation films 126, 122 down to the interconnections 118 by photolithography.

Next, plasma cleaning using argon gas is made. This plasma cleaning removes natural oxide film, etc. present on the surfaces of the interconnections 118. The conditions for the plasma cleaning are so set that, for example, the thermal oxide film is removed by 20 nm.

Then, a 50 nm-thickness TiN film 130 is formed by, e.g., sputtering.

Next, a 600 to 800 nm-thickness tungsten film 132 is formed by, e.g., CVD.

Next, the entire surface is etched back to remove the tungsten film 132 except that in the contact holes 128. Thus, the conductor plugs 132 of the tungsten are buried in the contact holes 128 (see FIG. 39).

Then, a 500 nm-thickness AlCu alloy film, a 10 nm-thickness Ti film and a 100 nm-thickness TiN film are formed on the entire surface by, e.g., sputtering. The TiN film, the AlCu alloy film, the Ti film and the TiN film form the layer film 134.

Then, the layer film 134 is patterned by photolithography. Thus, the interconnections 134 of the layer film are formed (see FIG. 40).

Next, thermal processing is made in an $N_2$ atmosphere. The thermal processing temperature is, e.g., 350° C., and the thermal processing period of time is, e.g., 30 minutes.

Next, the hydrogen diffusion preventive film 136 is formed on the entire surface by, e.g., sputtering or CVD. As the hydrogen diffusion preventive film 136, an aluminum oxide film of, e.g., a 20 to 100 nm-thickness is formed.

Figure 41:
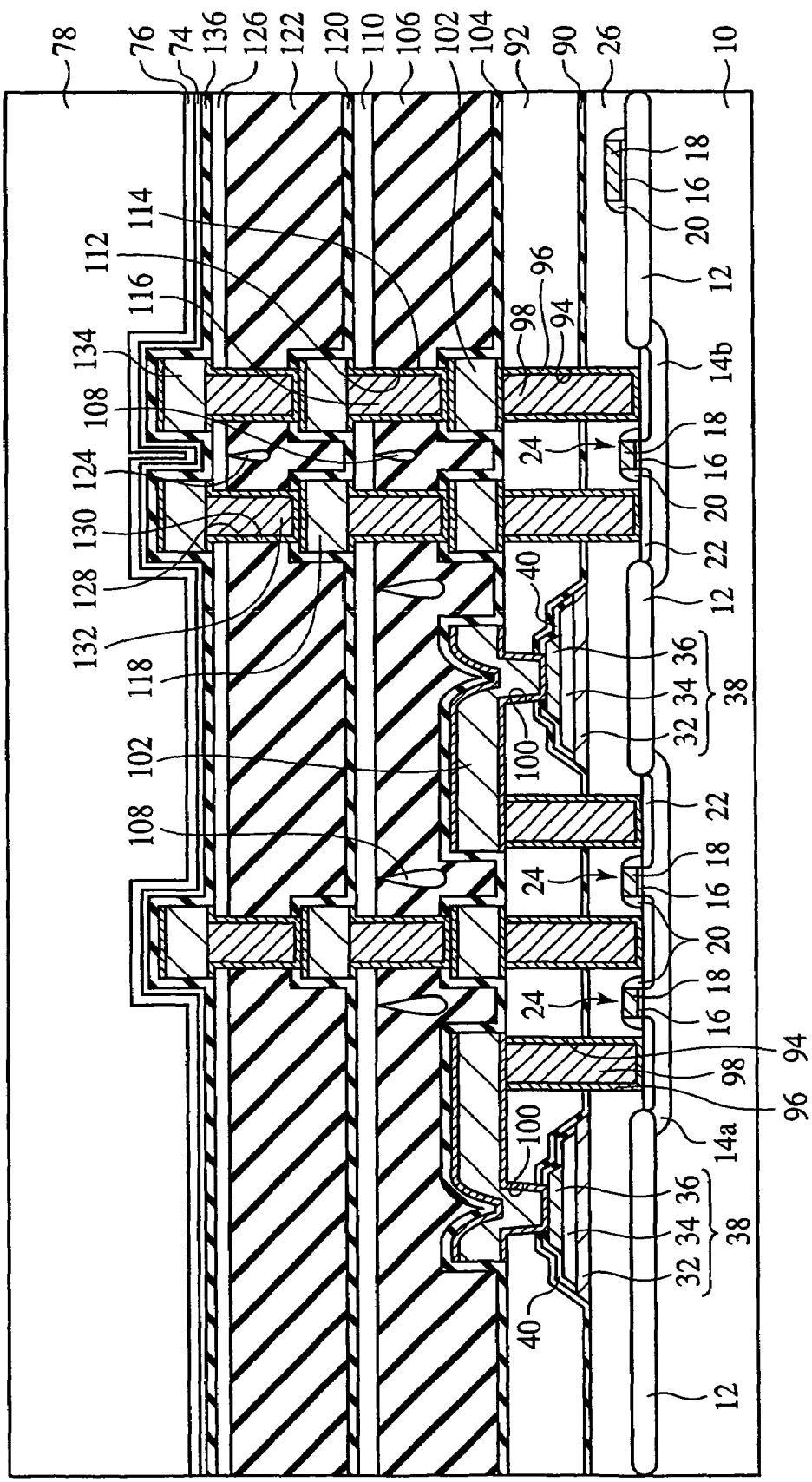
FIG. 41 is a sectional view of the semiconductor device according to the second embodiment in the steps of the method for fabricating the semiconductor device, which illustrates the method (Part 22).

Next, as illustrated in FIG. 41, a 200 to 300 nm-thickness silicon oxide film 74 is formed by plasma TEOS CVD.

Next, thermal processing is made in a plasma atmosphere generated by using $N_2O$ gas. This thermal processing is for removing water in the silicon oxide film 74 and also for improving the film quality of the silicon oxide film 74. The substrate temperature for the thermal processing is, e.g., 350° C. The flow rate of the $N_2O$ gas is, e.g., 1000 sccm. The flow rate of the $N_2$ gas is, e.g., 285 sccm. The gap of the opposed electrodes is, e.g., 300 mils. The applied high-frequency power is, e.g., 525 W. The gas pressure inside the chamber is, e.g., 3 Torr.

Then, a 350 nm-thickness silicon nitride film 76 is formed by, e.g., CVD. As described above, the silicon nitride film 76 is for blocking water to prevent the corrosion of the interconnections, etc. As described above, the processing of the step of forming the silicon nitride film 76 tends to damage the capacitors 38 by hydrogen, but because of the planarized hydrogen diffusion preventive films 120, 136 above the capacitors 38, the arrival of hydrogen at the dielectric film 34 of the capacitors 38 can be surely prevented.

Next, by photolithography, the openings (not illustrated) are formed in the silicon nitride film 76, the silicon oxide film 74 and the hydrogen diffusion preventive film 136 down to the electrode pads (not illustrated).

Next, a polyimide film 78 of, e.g., a 2 to 10 μm-thickness is formed by, e.g., spin coating.

Next, the openings (not illustrated) are formed in the polyimide film 78 down to the electrode pads (not illustrated) by photolithography.

Thus, the semiconductor device according to the present embodiment is fabricated.

Modified Embodiments

The present invention is applicable not only to the above-described embodiments, but also to various modifications.

For example, in the above-described embodiments, the ferroelectric film forming the dielectric film 34 is PZT film. However, the dielectric film 34 is not formed essentially of PZT film and may be formed suitably of any other dielectric film. For example, the ferroelectric film forming the dielectric film can be $Pb_{1-x}La_xZr_{1-y}Ti_yO_3$ film (PLZT film), $SrBi_2(Ta_xNb_{1-x})_2O_9$ film, $Bi_4Ti_2O_{12}$ film or others.

In the above-described embodiments, the dielectric film 34 is ferroelectric film and is not limited to ferroelectric film. For example, when DRAM, etc. are formed, the dielectric film 34 can be high dielectric film. The high dielectric film forming the dielectric film 34 can be, e.g., $(BaSr)TiO_3$ film (BST film), $SrTiO_3$ film (STO) film, $Ta_2O_5$ film or others. The high dielectric film is dielectric film whose specific dielectric constant is higher than that of silicon dioxide.

In the above-described embodiments, the upper electrodes 36 are formed of the layer film of $IrO_X$ film and Pt film. However, the material of the upper electrodes 36 is not limited to these materials and can be formed of, e.g., SrRuO film (SRO film).

In the above-described embodiments, the hydrogen diffusion preventive film is formed of aluminum oxide film. However, the hydrogen diffusion preventive film is not essentially formed of aluminum oxide film. Film having the function of preventing the diffusion of hydrogen can be suitably used as the hydrogen diffusion preventive film. For example, a film of metal oxide can be suitably used as the hydrogen diffusion preventive film. The hydrogen diffusion preventive film of metal oxide can be formed of, e.g., tantalum oxide, titanium oxide or others. The hydrogen diffusion preventive film is not essentially formed of metal oxide. For example, silicon nitride film ($Si_3N_4$ film), silicon nitride oxide film (SiON film) or others can be used as the hydrogen diffusion preventive film. However, the film formed of metal oxide is dense and can surely prevent the diffusion of hydrogen when formed relatively thin. From the viewpoint of the micronization, it is advantageous to for the hydrogen diffusion preventive film of metal oxide film.

INDUSTRIAL APPLICABILITY

The semiconductor device according to the present invention and the method for fabricating the semiconductor device are useful to improve the fabrication yield of semiconductor devices including capacitors.

The invention claimed is:

1. A semiconductor device fabricating method comprising:
   forming over a semiconductor substrate a capacitor including a lower electrode, a dielectric film formed over the lower electrode and an upper electrode formed over the dielectric film;
   forming a first insulation film over the semiconductor substrate and the capacitor;
   forming a contact hole in the first film down to the capacitor;
   forming over the first insulation film a first interconnection electrically connected to the capacitor via the contact hole;
   forming over the first insulation film a first hydrogen diffusion preventive film for preventing the diffusion of hydrogen, covering the first interconnection;
   forming a second insulation film over the first hydrogen diffusion preventive film;
   polishing the surface of the second insulation film to planarize the surface of the second insulation film;
   forming a third insulation film over the second insulation film;
   forming a second interconnection over the third insulation film; and
   forming over the third insulation film a second hydrogen diffusion preventive film for preventing the diffusion of hydrogen, covering the second interconnection,
   wherein in the forming the second interconnection, a solid conduction film is further formed at least above the capacitor,
   in the forming the second hydrogen diffusion preventive film, the second hydrogen diffusion preventive film is formed, covering the solid conduction film,
   the first hydrogen diffusion preventive film and the second hydrogen diffusion preventive film are formed of metal oxide,
   said method further comprises forming a silicon nitride film over the second hydrogen diffusion preventive film, and
   forming a polyimide film over the silicon nitride film.

2. A semiconductor device fabricating method according to claim 1, further comprising, after the forming the first insulation film and before the forming the first hydrogen diffusion preventive film, making thermal processing.

3. A semiconductor device fabricating method according to claim 1, further comprising, after the forming the second insulation film and before the forming the third insulation film, making thermal processing.

4. A semiconductor device fabricating method according to claim 1, further comprising, after the forming the third insulation film and before the forming the second hydrogen diffusion preventive film, making thermal processing.

* * * * *